United States Patent
Yang et al.

(10) Patent No.: US 12,295,186 B2
(45) Date of Patent: May 6, 2025

(54) DISPLAY DEVICE

(71) Applicant: Samsung Display Co., LTD., Yongin-si (KR)

(72) Inventors: Byung Choon Yang, Yongin-si (KR); Sung Kook Park, Yongin-si (KR); Dae Ho Song, Yongin-si (KR); Hyung Il Jeon, Yongin-si (KR); Joo Woan Cho, Yongin-si (KR); Jin Woo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 445 days.

(21) Appl. No.: 17/559,443

(22) Filed: Dec. 22, 2021

(65) Prior Publication Data
US 2022/0352419 A1    Nov. 3, 2022

(30) Foreign Application Priority Data
Apr. 30, 2021  (KR) .................. 10-2021-0056850

(51) Int. Cl.
| | |
|---|---|
| H10H 20/831 | (2025.01) |
| H01L 25/075 | (2006.01) |
| H10H 20/853 | (2025.01) |
| H10H 20/857 | (2025.01) |
| H10H 29/14 | (2025.01) |

(52) U.S. Cl.
CPC ..... *H10H 20/8312* (2025.01); *H01L 25/0753* (2013.01); *H10H 20/853* (2025.01); *H10H 20/857* (2025.01); *H10H 29/142* (2025.01)

(58) Field of Classification Search
None
See application file for complete search history.

(56) References Cited

U.S. PATENT DOCUMENTS

| | | |
|---|---|---|
| 10,468,552 B2 | 11/2019 | Lutgen |
| 2018/0323242 A1 | 11/2018 | Drzaic |

(Continued)

FOREIGN PATENT DOCUMENTS

| | | |
|---|---|---|
| KR | 10-2017-0031912 | 3/2017 |
| KR | 10-2020-0127235 | 11/2020 |
| KR | 10-2021-0038604 | 4/2021 |

OTHER PUBLICATIONS

Mohammadreza Khorasaninejad et al., "Metalenses at visible wavelengths: Diffraction-limited focusing and subwavelength resolution imaging", Science, Jun. 3, 2016, pp. 1190-1194, vol. 352, Issue 6290.

(Continued)

*Primary Examiner* — Jay C Chang
(74) *Attorney, Agent, or Firm* — KILE PARK REED & HOUTTEMAN PLLC

(57) ABSTRACT

A display device includes a first electrode disposed on a substrate; a light emitting element disposed on the first electrode, the light emitting element being electrically connected to the first electrode; a second electrode disposed on the light emitting element, the second electrode being electrically connected to the light emitting element; a meta structure disposed on the second electrode, the meta structure overlapping the light emitting element; and a bank pattern disposed on the substrate, the bank pattern being spaced apart from the light emitting element.

20 Claims, 30 Drawing Sheets

(56) References Cited

U.S. PATENT DOCUMENTS

| | | |
|---|---|---|
| 2020/0056091 A1 | 2/2020 | Piquette et al. |
| 2020/0135703 A1 | 4/2020 | Ahmed et al. |
| 2021/0005681 A1 | 1/2021 | Chen |
| 2022/0029135 A1* | 1/2022 | Chen .................. H10K 59/00 |
| 2023/0163156 A1* | 5/2023 | Tan .................. H01L 33/0093 257/89 |

OTHER PUBLICATIONS

Alexander V. Kildishev et al., "Planar Photonics with Metasurfaces", Science, Mar. 15, 2013, vol. 339, Issue 6125, 1232009.

\* cited by examiner

NS

NS

NS

DISPLAY DEVICE

CROSS-REFERENCE TO RELATED APPLICATION(S)

This application claims priority to and benefits of Korean Patent Application No. 10-2021-0056850 under 35 U.S.C. § 119, filed on Apr. 30, 2021, in the Korean Intellectual Property Office, the entire contents of which are incorporated herein by reference.

BACKGROUND

1. Technical Field

The disclosure relates to a display device.

2. Related Art

Recently, as interest in information displays has increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including a meta structure overlapping a light emitting element.

In an embodiment, a display device may include a first electrode disposed on a substrate; a light emitting element disposed on the first electrode, the light emitting element being electrically connected to the first electrode; a second electrode disposed on the light emitting element, the second electrode being electrically connected to the light emitting element; a meta structure disposed on the second electrode, the meta structure overlapping the light emitting element; and a bank pattern disposed on the substrate, the bank pattern being spaced apart from the light emitting element.

The display device may further include a color conversion layer disposed on a side surface of the bank pattern and disposed on the light emitting element; an encapsulation layer covering the second electrode and the bank pattern; and a color filter layer disposed on the encapsulation layer.

The color conversion layer may fill a space between the bank pattern and the light emitting element.

The meta structure may include a transparent base layer disposed on the color filter layer; and a nano optical pattern disposed on the transparent base layer.

The meta structure may include a transparent base layer disposed on the encapsulation layer, the transparent base layer and the encapsulation layer being integral with each other; and a nano optical pattern disposed on the transparent base layer.

The color filter layer may be disposed on the meta structure.

The light emitting element and the bank pattern may be formed on a same layer and may include a same material.

Each of the light emitting element and the bank pattern may include a first semiconductor layer; a second semiconductor layer disposed on the first semiconductor layer; and an active layer disposed between the first semiconductor layer and the second semiconductor layer.

The bank pattern may further include a first mask layer and a second mask layer which are sequentially stacked on the second semiconductor layer.

The display device may further include a reflective member disposed on the side surface of the bank pattern, the reflective member reflecting light emitted from the light emitting element in a display direction.

The meta structure may include a transparent base layer disposed on the second electrode located on a top surface of the light emitting element; and a nano optical pattern disposed on the transparent base layer.

The meta structure may contact the color conversion layer.

The display device may further include a light blocking pattern disposed on the encapsulation layer and overlapping at least a portion of the bank pattern.

The color filter may contact a top surface of the light blocking pattern.

The light blocking pattern may contact a side surface of the color filter layer and a side surface of the meta structure, and the light blocking pattern may be disposed on a portion of a top surface of the meta structure.

The second electrode, the light emitting element, and the bank pattern may be integral with each other.

In an embodiment, a display device may include a first pixel, a second pixel, and a third pixel that include light emitting elements disposed on a substrate; bank patterns provided while being spaced apart from the light emitting elements, the bank patterns partitioning the first pixel, second pixel, and the third pixel; a meta structure provided while overlapping with the light emitting elements, the meta structure including a first meta surface, a second meta surface and a third meta surface respectively corresponding to the first pixel, the second pixel, and the third pixel; and a color conversion layer filling a space between the bank patterns, the color conversion layer covering the light emitting elements. Patterns of the first meta surface, the second meta surface and the third meta surface are different from each other.

The display device may further include an encapsulation layer covering the color conversion layer and the bank patterns; and a color filter layer provided on the encapsulation layer, the color filter layer including a first color filter, a second color filter, and a third color filter respectively corresponding to the first pixel, the second pixel, and the third pixel. The meta structure may be disposed on the color filter layer.

The display device may further include an encapsulation layer covering the color conversion layer and the bank patterns; and a color filter layer disposed on the encapsulation layer, the color filter layer including a first color filter, a second color filter, and a third color filter respectively corresponding to the first pixel, the second pixel and the third pixel. The meta structure may be disposed between the encapsulation layer and the color filter layer.

The display device may further include an encapsulation layer covering the color conversion layer and the bank patterns; and a color filter layer disposed on the encapsulation layer, the color filter layer including first to third color filters respectively corresponding to the first to third pixels. The meta structure may be disposed on the light emitting elements. The color conversion layer may cover the meta structure.

In an embodiment, a may include the meta structure layer provided on the color filter layer, so that the light emission efficiency (the intensity of light) emitted from the pixels may be improved, and/or the light distribution of the emitted light may be adaptively controlled by controlling the convergence, deflection, diffusion, and polarization of the emitted light to correspond to design purposes. Accordingly, the image quality of the display device may be improved. The light emitting element and the bank pattern may be simultaneously formed, and the color conversion layer may be filled between the bank patterns, so that the manufacturing process of the display device may be simplified, and the thickness of the display device may be decreased.

BRIEF DESCRIPTION OF THE DRAWINGS

The above and other aspects and features of the disclosure will become more apparent by describing in detail embodiments thereof with reference to the attached drawings.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
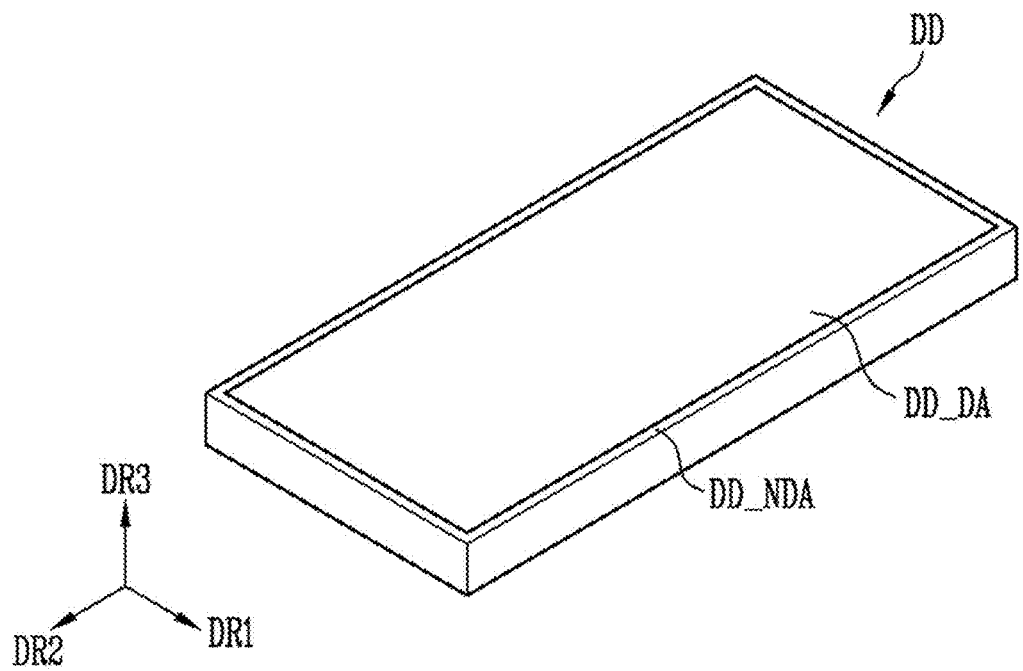
FIG. 1 is a schematic view illustrating a display device according to an embodiment.

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In this specification, it will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Hereinafter, embodiments of the disclosure will be described in more detail with reference to the accompanying drawings. Throughout the drawings, the same reference numerals are given to the same elements, and their descriptions will not be repeated.

Figure 2:
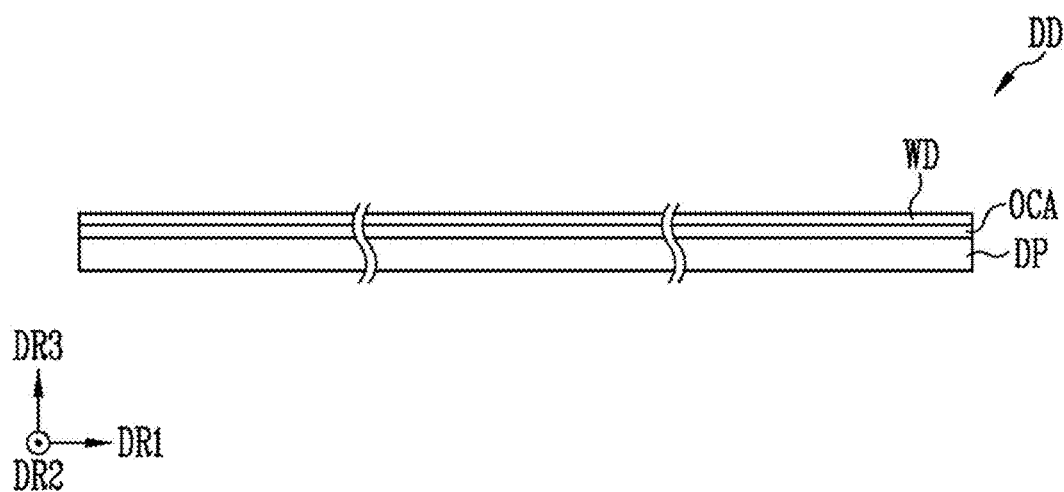
FIG. 2 is a schematic cross-sectional view of the display device shown in FIG. 1.
Figure 3:
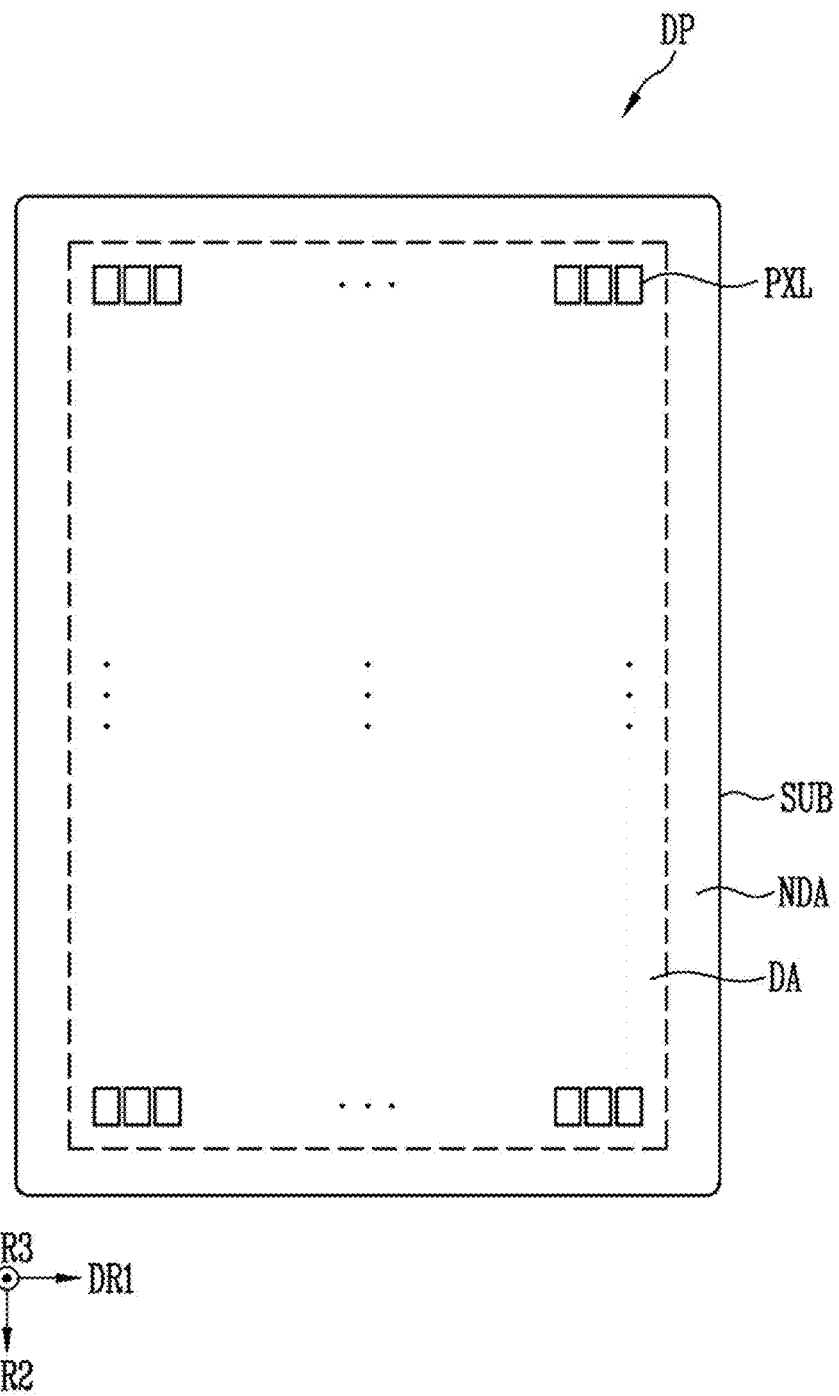
FIG. 3 is a schematic plan view of a display panel included in the display device shown in FIG. 2.

FIG. 1 is a schematic view illustrating a display device in accordance with embodiments of the disclosure. FIG. 2 is a schematic cross-sectional view illustrating an example of the display device shown in FIG. 1. FIG. 3 is a schematic plan view illustrating an example of a display panel included in the display device shown in FIG. 2.

Referring to FIGS. 1, 2, and 3, the display device DD may include a display panel DP and a window WD. The window WD may be attached to the display panel with an optically clear adhesive OCA. The first and second directions, DR1 and DR2, may represent a plane of the display surface, and the third direction DR3 may represent the thickness of the display device.

The disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, an automotive display (or vehicle display), a transparent display, or a wearable device (e.g., glasses or a smart watch).

The display panel DP may have various shapes. For example, the display panel DP may be provided in a rectangular plate shape, but the disclosure is not limited thereto. For example, the display panel DP may have a shape such as a circular shape or an elliptical shape. Also, the display panel DP may include an angular corner and/or a curved corner.

In an embodiment, at least a portion of the display device DD may have flexibility, and the display device DD may be folded at the portion having the flexibility.

The display device DD may include a display area DD_DA in which an image is displayed and a non-display area DD_NDA provided at (or disposed on) at least one side of the display area DD_DA. The non-display area DD_NDA is an area in which the image is not displayed. However, the embodiments are not limited thereto. In some embodiments, shapes of the display area DD_DA and the non-display area DD_NDA may be designed relative to each other.

In some embodiments, the display device DD may include a sensing area and a non-sensing area. The display device DD may not only display an image through the sensing area, but also sense a touch input made on a display surface (or input surface) or sense light incident at the front. The non-sensing area may surround the sensing area. However, the disclosure is not limited thereto. In some embodiments, a partial area of the display area DD_DA may correspond to the sensing area.

The display panel DP may display an image. A self-luminescent display panel, such as an inorganic light emitting display panel using an inorganic light emitting diode as a light emitting element, a micro-scale or nano-scale LED display panel using small LEDs with a size in the micrometer range (or nanometer range), or a quantum dot light emitting display panel (QD LED panel) using a quantum dot and an inorganic light emitting diode, may be used as the display panel DP. An organic light emitting display panel (OLED panel) using an organic light emitting diode as a light emitting element, or the like may be used as the display panel DP.

As shown in FIG. 3, the display panel DP may include a substrate SUB and pixels PXL provided on the substrate SUB.

The substrate SUB may be provided in various shapes, corresponding to the shape of the display device DD. For example, the substrate SUB may be formed as one area having an approximately rectangular shape. However, the number of areas provided in the substrate SUB may be different from the above-described example, and the substrate SUB may have different shapes according to an area provided in the substrate SUB.

The substrate SUB may be made of an insulative material such as glass or resin. Also, the substrate SUB may be made of a material having flexibility to be bendable or foldable, and have a single- or multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the substrate SUB is not limited to the above-described embodiments.

The substrate SUB (or the display panel DP) may include a display area DA and a non-display area NDA. The display area DA may be an area in which the pixels PXL are provided to display an image. The non-display area NDA is an area in which the pixels PXL are not provided, and may be an area in which the image is not displayed.

The display area DA may correspond to the display area DD_DA of the display device DD, and the non-display area NDA may correspond to the non-display area DD_NDA of the display device DD.

A driving unit for driving the pixels PXL and some of lines (not shown), which connect the pixels PXL and the driver to each other may be provided in the non-display area NDA. The non-display area NDA may correspond to a bezel area of the display device DD.

The pixel PXL may be provided in the display region DA of the substrate SUB. The pixel PXL may be a minimum unit which displays an image. The pixel PXL may include a light emitting element emitting white light and/or colored light. The pixel PXL may emit light of any one color among red, green, and blue. However, the disclosure is not limited thereto, and each of the pixels PXL may emit light of a color such as cyan, magenta, yellow or the like.

The pixels PXL may be arranged along rows extending in a first direction DR1 and columns extending in a second direction DR2 intersecting the first direction DR1. However, the arrangement of the pixels PXL is not particularly limited, and the pixels PXL may be arranged in various forms.

When pixels PXL are provided, the pixels PXL may be provided to different areas (or sizes). For example, when pixels PXL having different colors of lights emitted therefrom are provided, the pixels PXL may be provided to have different areas (or sizes) or different shapes with respect to the colors.

Figure 4A:
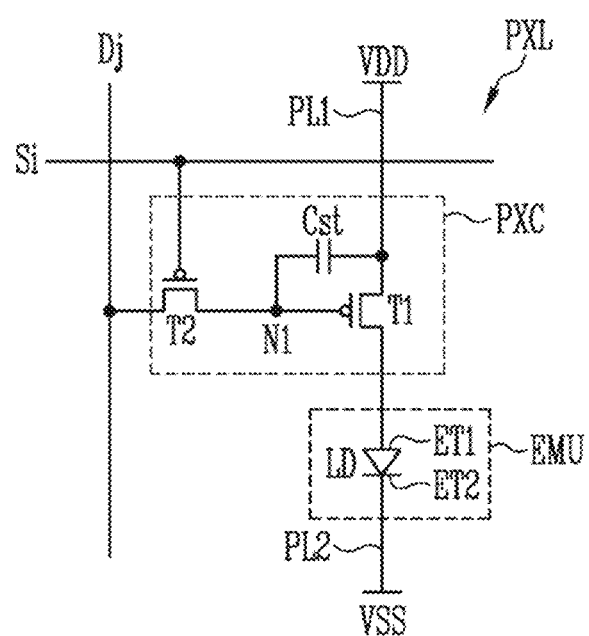
FIGS. 4A and 4B are schematic diagrams of equivalent circuits illustrating a pixel included in the display panel shown in FIG. 3.
Figure 4B:
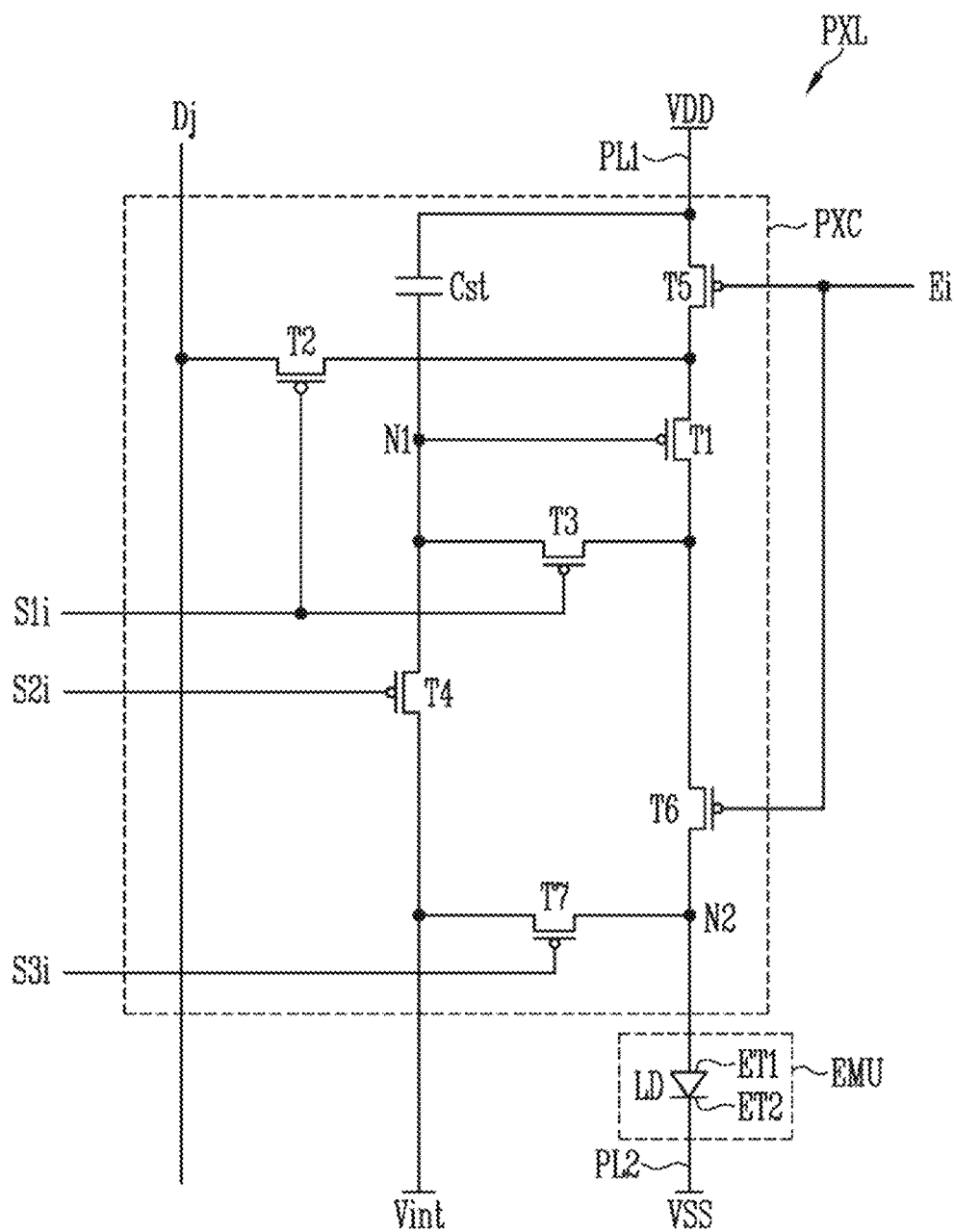

FIGS. 4A and 4B are schematic diagrams of equivalent circuits illustrating the pixel included in the display panel shown in FIG. 3.

Referring to FIGS. 4A and 4B, a pixel PXL may include a light emitting unit EMU and/or a light emitting element LD, generating light with a luminance corresponding to a data signal. Also, the pixel PXL may selectively further include a pixel circuit PXC for driving the light emitting unit EMU.

In some embodiments, the light emitting unit EMU may include a light emitting element LD electrically connected between a first power line PL1 to which a voltage of a first driving power source VDD is applied and a second power line PL2 to which a voltage of a second driving power source VSS is applied. For example, the light emitting unit EMU may include a first electrode ET1 electrically connected to the first driving power source VDD via the pixel circuit PXC and the first power line PL1, a second electrode ET2 electrically connected to the second driving power source VSS through the second power line PL2, and a light emitting element LD electrically connected between the first and second electrodes ET1 and ET2. In an embodiment, light emitting elements LD may be electrically connected in parallel in the same direction between the first electrode ET1 and the second electrode ET2.

In an embodiment, the first electrode ET1 may be an anode electrode, and the second electrode ET2 may be a cathode electrode.

The first driving power source VDD and the second driving power source VSS may have different potentials. For example, the first driving power source VDD may be set as a high-potential power source, and the second driving power source VSS may be set as a low-potential power source. A potential difference between the first and second driving power sources VDD and VSS may be set equal to or higher than a threshold voltage of the light emitting elements LD during an emission period of the pixel PXL.

As described above, the light emitting elements LD electrically connected in parallel in the same direction (e.g., a forward direction) between the first electrode ET1 and the second electrode ET2 may form effective light sources, respectively. These effective light sources may constitute the light emitting unit EMU of the pixel PXL.

The light emitting element LD may emit light with a luminance corresponding to a driving current supplied through the pixel circuit PXC.

The pixel circuit PXC may be electrically connected to a scan line Si and a data line Dj of a corresponding pixel PXL. For example, when assuming that the pixel PXL is disposed on an ith (i is a positive integer) row and a jth (j is a positive integer) column of the display area DA, the pixel circuit PXC may be electrically connected to an ith scan line Si (hereinafter, referred to as a scan line Si) and a jth data line Dj (hereinafter, referred to as a data line Dj).

In an embodiment, as shown in FIG. 4A, the pixel circuit PXC may include a first transistor T1, a second transistor T2, and a storage capacitor Cst.

A first terminal of the first transistor T1 (driving transistor) may be electrically connected to the first driving power source VDD, and a second terminal of the first transistor T1 may be electrically connected to the light emitting element LD. A gate electrode of the first transistor T1 may be electrically connected to a first node N1. The first transistor T1 controls an amount of driving current supplied to the light emitting element LD, corresponding to a voltage of the first node N1.

A first terminal of the second transistor T2 (switching transistor) may be electrically connected to the data line Dj, and a second terminal of the second transistor T2 may be electrically connected to the first node N1. The first terminal and the second terminal of the second transistor T2 are different terminals. For example, when the first terminal is a source electrode, the second terminal may be a drain electrode. A gate electrode of the second transistor T2 may be electrically connected to the scan line Si.

When the second transistor T2 is turned on, the data line Dj and the first node N1 are electrically connected to each other. A data signal of a corresponding frame is supplied to the data line Dj. Accordingly, the data signal is transferred to the first node N1. The data signal transferred to the first node N1 is charged in the storage capacitor Cst.

One electrode of the storage capacitor Cst may be electrically connected to the first driving power source VDD, and another electrode of the storage capacitor Cst may be electrically connected to the first node N1. The storage capacitor Cst may charge a voltage corresponding to the data signal supplied to the first node N1.

The pixel circuit PXC of the disclosure is not limited thereto, and the structure of the pixel circuit PXC may be variously modified and embodied.

In an embodiment, as shown in FIG. 4B, the pixel circuit PXC may include first to seventh transistors T1 to T7 and a storage capacitor Cst.

The first transistor T1 (driving transistor) may be electrically connected between the first driving power source VDD and the light emitting element LD. A gate electrode of the first transistor T1 may be electrically connected to a first node N1.

The second transistor T2 may be electrically connected between the data line Dj and a first electrode (e.g., a source electrode) of the first transistor T1. A gate electrode of the second transistor T2 may be electrically connected to a first scan line S1i. For example, the first scan line S1i may correspond to the ith scan line Si. When the second transistor T2 is turned on, a data signal supplied from the data line Dj may be transferred to the first transistor T1.

The third transistor T3 may be electrically connected between a second electrode (e.g., a drain electrode) of the first transistor T1 and the first node N1. A gate electrode of the third transistor T3 may be electrically connected to the first scan line S1i. When the third transistor T3 is turned on, the drain electrode of the first transistor T1 and the first node N1 may be electrically connected to each other.

The fourth transistor T4 may be electrically connected between the first node N1 and an initialization power line to which a voltage of an initialization power source Vint is applied. A gate electrode of the fourth transistor T4 may be electrically connected to a second scan line S2i. For example, the second scan line S2i may correspond to an (i−1)th scan line Si−1. When the fourth transistor T4 is turned on, the voltage of the initialization power source Vint may be transferred to the first node N1. In an embodiment, the initialization power source Vint may have a voltage level lower than a minimum voltage level of the data signal.

The fifth transistor T5 may be electrically connected between the first driving power source VDD and the first transistor T1. A gate electrode of the fifth transistor T5 may be electrically connected to an ith emission control line Ei (hereinafter, referred to as an emission control line). The sixth transistor T6 may be electrically connected between the first transistor and an end portion of the light emitting element LD (or a second node N2). A gate electrode of the sixth transistor T6 may be electrically connected to the emission control line Ei. The fifth and sixth transistors T5 and T6 may be turned off when an emission control signal having a gate-off voltage is supplied to the emission control line Ei, and be turned on in other cases.

The seventh transistor T7 may be electrically connected between an end portion of the light emitting element LD and the initialization power line. A gate electrode of the seventh transistor T7 may be electrically connected to a third scan line S3i. For example, the third scan line S3i may correspond to one of the (i−1)th scan line Si−1, the ith scan line Si, and an (i+1)th scan line Si+1. When the seventh transistor T7 is turned on, the voltage of the initialization power source Vint may be supplied to the end portion of the light emitting element LD.

The storage capacitor Cst may be electrically connected to the first driving power source VDD and the first node N1. The storage capacitor Cst may store a voltage corresponding to the data signal supplied to the first node N1 and a threshold voltage of the first transistor T1.

The structure of a pixel PXL which may be applied to the disclosure is not limited to the embodiments shown in FIGS. 4A and 4B, and the corresponding pixel may have various structures. In an embodiment of the disclosure, each pixel PXL may be configured inside of a passive type of light emitting display device. The pixel circuit PXC may be omitted, and both end portions of the light emitting element LD included in the light emitting unit EMU may be connected (e.g., directly connected) to each of the scan lines S1i, S2i, and S3i, the data line Dj, the first power line PL1, the second power line PL2, and/or a control line.

Although the transistors included in the pixel circuit PXC illustrated in FIGS. 4A and 4B are all P-type transistors, the disclosure is not limited thereto. At least one of the transistors T1 to T7 included in the pixel circuit PXC may be an N-type transistor.

Figure 5:
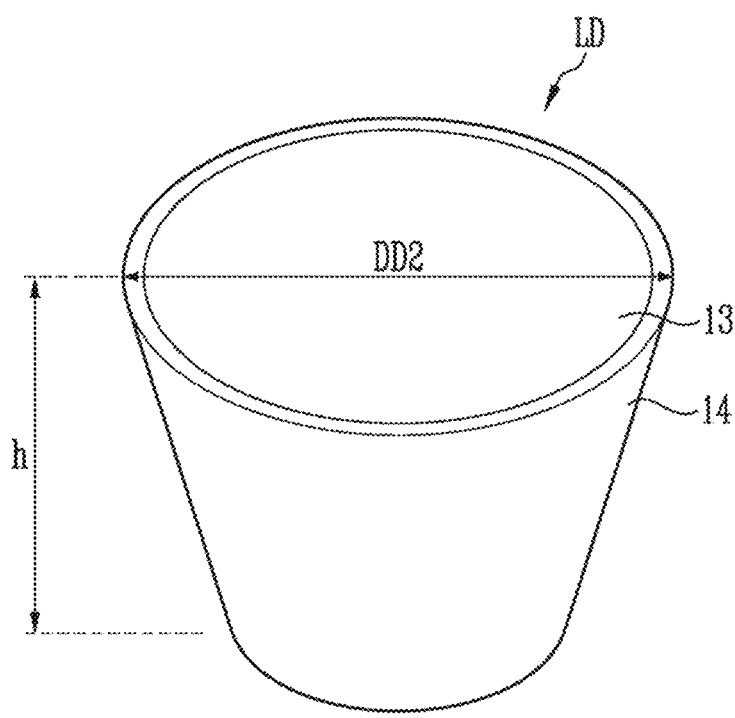
FIG. 5 is a schematic perspective view illustrating an example of a light emitting element included in a pixel.
Figure 6:
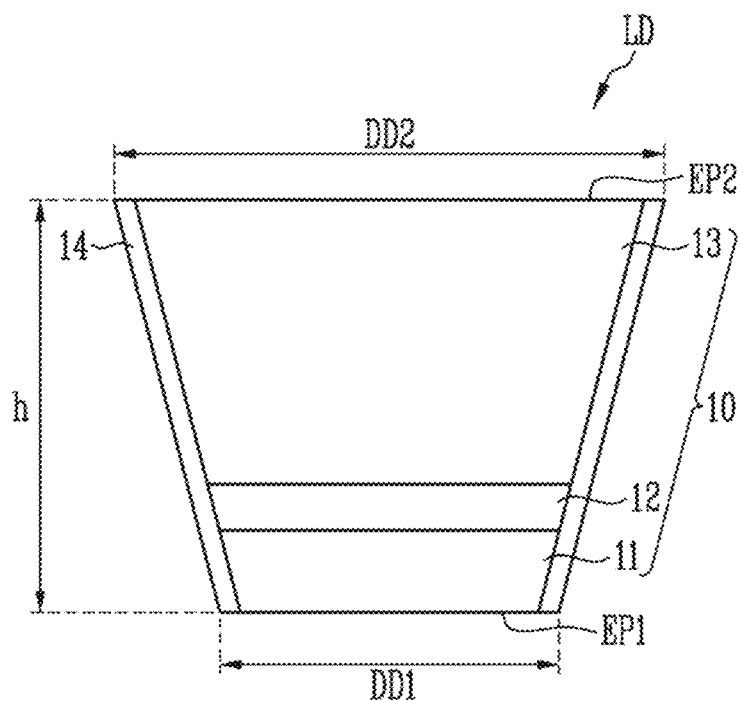
FIG. 6 is a schematic cross-sectional view illustrating an example of the light emitting element shown in FIG. 5.

FIG. 5 is a schematic perspective view illustrating an example of a light emitting element included in a pixel. FIG. 6 is a schematic cross-sectional view illustrating an example of the light emitting element shown in FIG. 5.

Referring to FIGS. 5 and 6, the light emitting element LD may include a first semiconductor layer 11, an active layer 12, and a second semiconductor layer 13. For example, the light emitting element LD may be configured as a light emitting stack structure 10 in which the first semiconductor layer 11, the active layer 12, and the second semiconductor layer 13 are sequentially stacked. In some embodiments, the light emitting element LD may further include a bonding electrode layer (not shown). The bonding electrode layer may be provided on a surface of the first semiconductor layer 11 or a surface of the second semiconductor layer 13.

Along a height h direction of the light emitting element LD, an upper surface may be referred to as a second end portion EP2, and a lower surface may be referred to as a first end portion EP1.

In an embodiment, the light emitting element LD may have a pillar shape in which a diameter DD1 of the first end portion EP1 and a diameter DD2 of the second end portion EP2 are different from each other. For example, the light emitting element LD may have a pillar shape in which the diameter DD1 of the first end portion EP1 is smaller than that DD2 of the second end portion EP2. The light emitting element LD may have an elliptical pillar shape where the diameter increases approaching the top along the height h direction.

However, the disclosure is not limited thereto. In some embodiments, the light emitting element LD may have a pillar shape in which the diameter DD1 of the first end portion EP1 is greater than that DD2 of the second end portion EP2. For example, the light emitting element LD may have an elliptical pillar shape where the diameter decreases approaching the top along the height h direction. In other examples, the diameter DD1 of the first end portion EP1 and the diameter DD2 of the second end portion EP2 may be substantially equal to each other.

In some embodiments, the shape of the first end portion EP1 and the second end portion EP2 of the light emitting element LD may be implemented as a polygonal shape such as a rectangular shape, a square shape, a triangular shape, or a pentagonal shape. In some embodiments, the light emitting element LD may have a truncated pyramid shape of which upper and lower surfaces have different areas.

The light emitting element LD may have a size in the range of nanometers to micrometers. However, the size of the light emitting element LD is not limited thereto, and may be variously changed according to design conditions of various types of devices (e.g., a display device, and the like) using, as a light source, a light emitting device using the light emitting element LD.

The first semiconductor layer 11 may include, for example, at least one p-type semiconductor layer. For example, the first semiconductor layer 11 may include at least one semiconductor material among GaN, InAlGaN, AlGaN, InGaN, AlN, and InN, and include a p-type semiconductor layer doped with a first conductivity type dopant (or p-type dopant) such as Mg, Zn, Ca, Sr or Ba. For example, the first semiconductor layer 11 may include a GaN semiconductor material doped with a first conductivity type dopant (or p-type dopant), but the disclosure is not limited thereto. The first semiconductor layer 11 may be configured with various materials.

The active layer 12 is disposed between the first semiconductor layer 11 and the second semiconductor layer 13, and may be formed in a single-quantum well structure or a multi-quantum well structure. For example, when the active layer 12 is formed in the multi-quantum well structure, a barrier layer (not shown), a strain reinforcing layer (not shown), and a well layer (not shown), which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer ACT is not limited to the above-described embodiment.

The active layer 12 may use a double hetero structure. In an embodiment, a clad layer (not shown) doped with a conductivity type dopant may be formed on the top and/or the bottom of the active layer 12 along the length L direction of the light emitting element LD. For example, the clad layer may be formed as an AlGaN layer or InAlGaN layer. In some embodiments, a material such as AlGaN or AlInGaN may be used to form the active layer 12. The active layer 12 may be configured with various materials.

The second semiconductor layer 13 is disposed on the active layer 12, and may include a semiconductor layer having a type different from that of the first semiconductor layer 11. In an embodiment, the second semiconductor layer 13 may include at least one n-type semiconductor layer. For example, the second semiconductor layer 13 may include any one semiconductor material among GaN, InAlGaN, AlGaN, InGaN, AlN, and InN, and be an n-type semiconductor layer doped with a second conductivity type dopant (or n-type dopant) such as Si, Ge or Sn. For example, the second semiconductor layer 13 may include a GaN semiconductor material doped with a second conductivity type dopant (or n-type dopant). However, the material constituting the second semiconductor layer 13 is not limited thereto. The second semiconductor layer 13 may be configured with various materials.

Although each of the first semiconductor layer 11 and the second semiconductor layer 13 are illustrated as single layers, the disclosure is not limited thereto. In an embodiment of the disclosure, each of the first semiconductor layer 11 and the second semiconductor layer 13 may further include at least one layer, e.g., a clad layer (not shown) and/or a Tensile Strain Barrier Reducing (TSBR) layer (not shown) according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GAInP, p-AlInP or p-Al-GaInP, but the disclosure is not limited thereto.

In some embodiments, the light emitting element LD may further include an electrode (not shown) disposed on the bottom of the first semiconductor layer 11 and/or the top of the second semiconductor layer 13, in addition to the first semiconductor layer 11, the active layer 12, and the second semiconductor layer 13, which are described above. The electrode may be an ohmic contact electrode, but the disclosure is not limited thereto. In some embodiments, the electrode may be a Schottky contact electrode. The electrode may include a conductive material. For example, the electrode may include an opaque metal using one or mixture of chromium (Cr), titanium (Ti), aluminum (Al), gold (Au), nickel (Ni), and any alloy thereof, but the disclosure is not limited thereto. In some embodiments, the electrode may include a transparent conductive oxide such as indium tin oxide (ITO), indium zinc oxide (IZO), zinc oxide (ZnO), indium gallium zinc oxide (IGZO), or indium tin zinc oxide (ITZO). Also, the electrode may be a part that contacts (e.g., directly contacts) an anode or a cathode.

In an embodiment, the light emitting element LD may further include an insulative film 14. In some embodiments, the insulative film 14 may be omitted, and be provided to cover only a portion of the light emitting stack structure 10.

The insulative film 14 may prevent an electrical short circuit that may occur when the active layer 12 contacts a conductive material except the first semiconductor layer 11 and the second semiconductor layer 13. Also, the insulative film 14 minimizes surface defects of the light emitting element LD, thereby improving the lifetime and light emission efficiency of the light emitting element LD. Also, when light emitting elements LD are densely disposed, the insulative film 14 may prevent an unwanted short circuit that may occur between the light emitting elements LD. As long as short-circuits between the active layer ACT and an external conductive material may be prevented, the insulative film 14 is not required in the embodiments.

The light emitting element LD may further include a reflective member (not shown) surrounding an outer circumferential surface of the insulative film 14. The reflective member may be made of a reflective material that concentrates the light emitting element LD on an area while allowing the light emitted from the light emitting element LD to advance in an image display direction. For example, the reflective member may be made of a conductive material (or substance) having a level of reflexibility.

Figure 7:
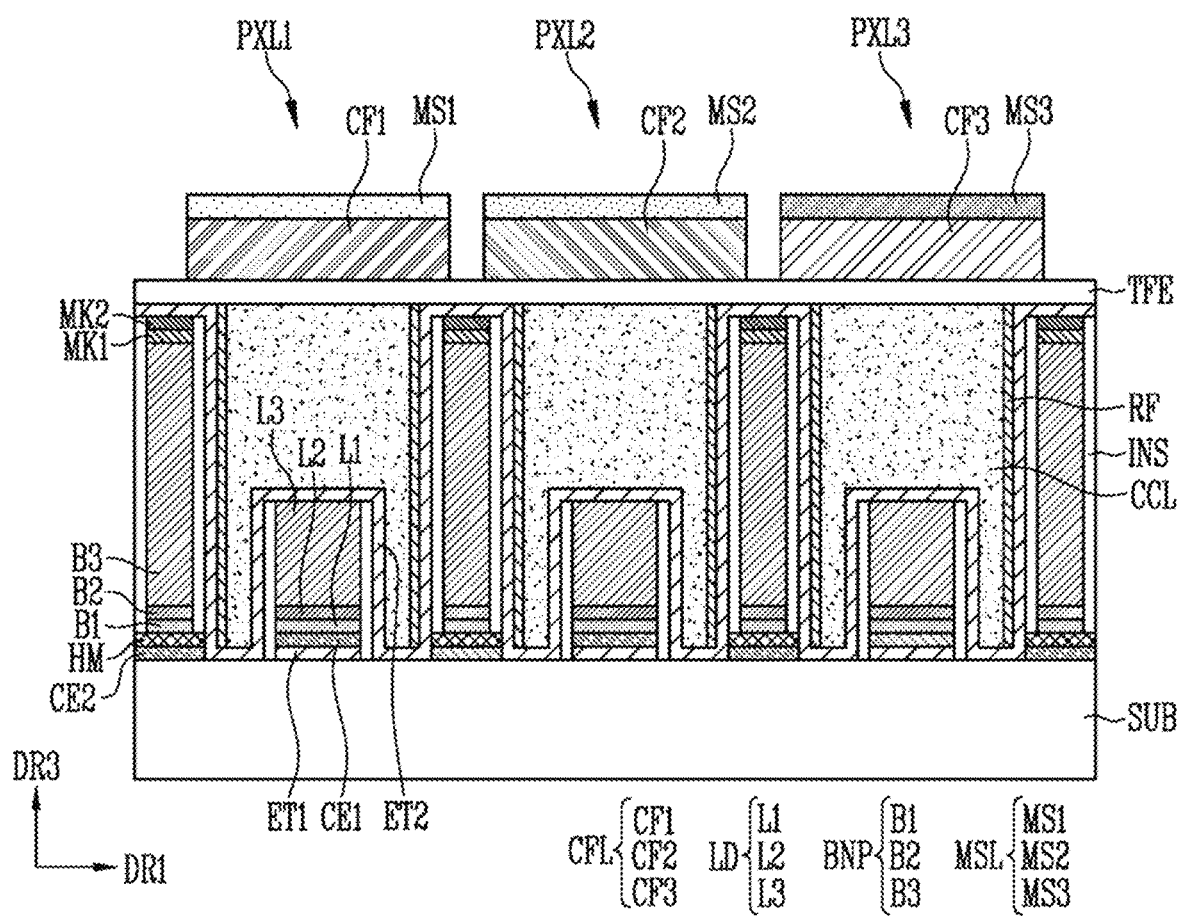
FIG. 7 is a schematic cross-sectional view illustrating an example of the display device shown in FIG. 1.
Figure 8:
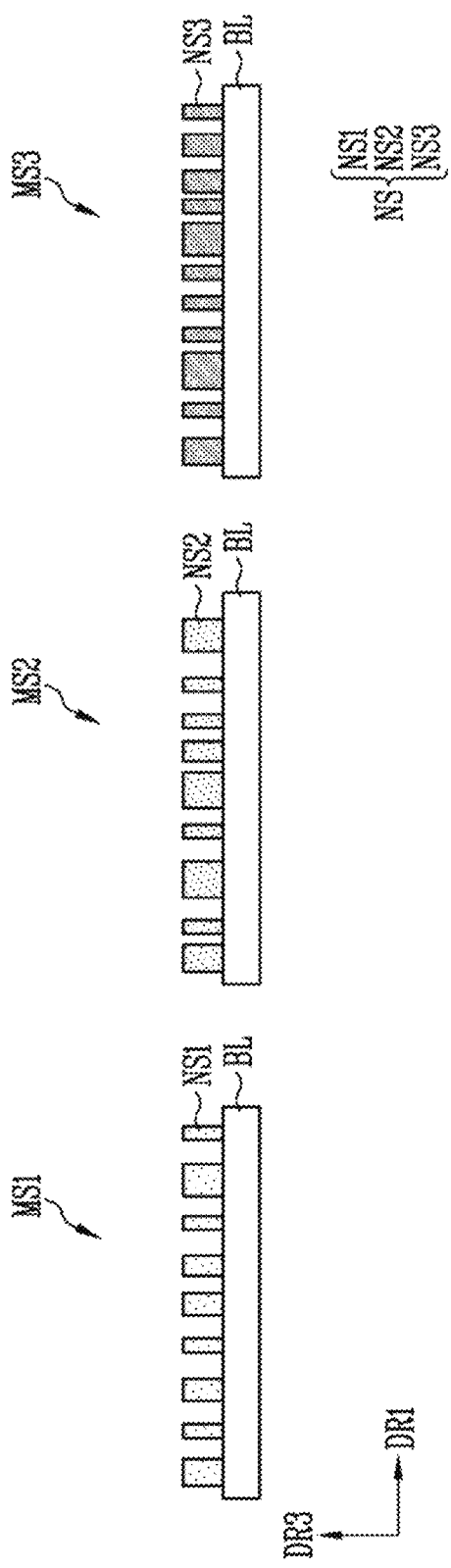
FIG. 8 is a schematic cross-sectional view illustrating an example of a meta structure included in the display device shown in FIG. 7.
Figure 9A:
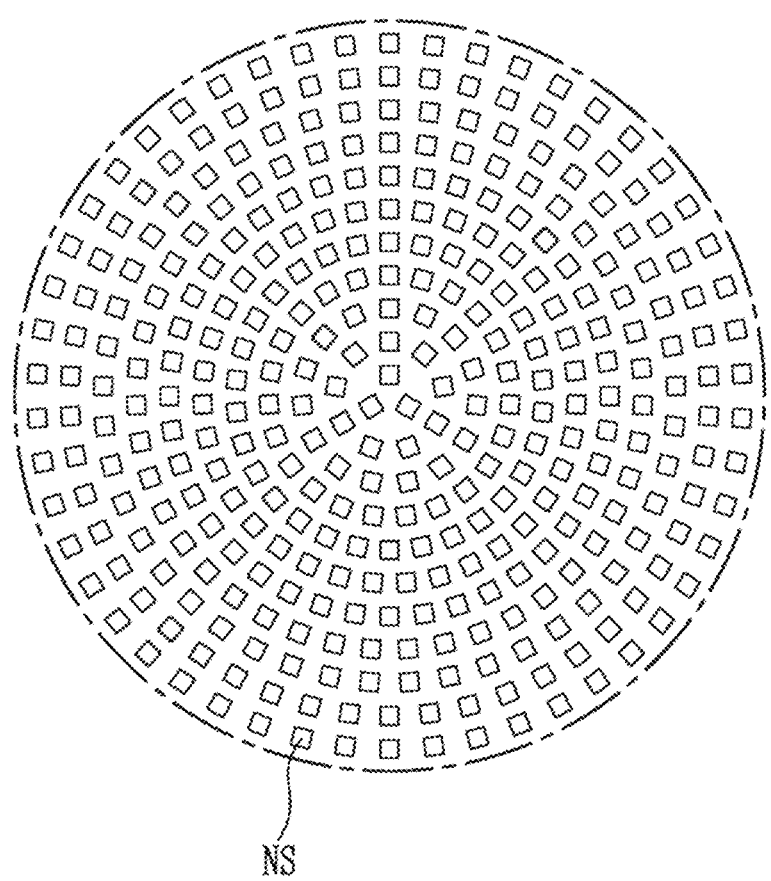
FIGS. 9A to 9C are schematic views illustrating examples of a nano optical pattern included in the meta structure shown in FIG. 8.
Figure 9B:
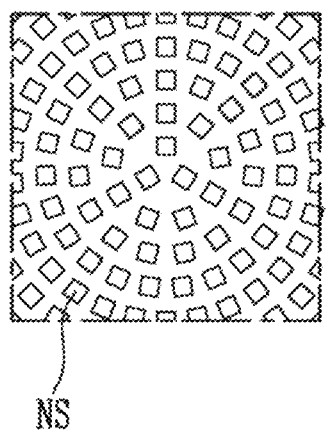
Figure 9C:
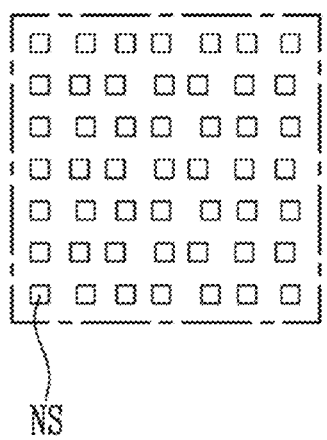

FIG. 7 is a schematic cross-sectional view illustrating an example of the display device shown in FIG. 1. FIG. 8 is a schematic cross-sectional view illustrating an example of a meta structure included in the display device shown in FIG. 7. FIGS. 9A to 9C are schematic views illustrating examples of a nano optical pattern included in the meta structure shown in FIG. 8.

In FIG. 7, a schematic cross-sectional structure of a first pixel PXL1, a second pixel PXL2, and a third pixel PXL3, which are adjacent to each other, is illustrated.

Referring to FIGS. 7, 8, 9A, 9B, and 9C, the display device including the first to third pixels PXL1, PXL2, and PXL3 may include a substrate SUB, and bank patterns BNP, a light emitting element LD, a color conversion layer CCL, a color filter layer CFL, and a meta structure layer MSL, which are disposed on the substrate SUB.

In an embodiment, the first to third pixels PXL1, PXL2, and PXL3 emit lights of different colors. For example, the first to third pixels PXL1, PXL2, and PXL3 respectively may emit red light, green light, and blue light.

The substrate SUB may be a driving substrate including a circuit element, and the like, including the transistors constituting the pixel circuit (PXC shown in FIG. 4A or 4B) of each of the first to third pixels PXL1, PXL2, and PXL3. For example, the substrate SUB may include a rigid or flexible base layer. For example, the base layer may be implemented as a glass substrate, a quartz substrate, a glass ceramic substrate, a crystalline glass substrate, etc. In another example, the base layer may be implemented as a polymer organic substrate including polyimide, polyamide or the like, a plastic substrate, etc. A backplane structure including transistors, a circuit element, and the like may be formed on the base layer. In the disclosure, for convenience of description, the substrate SUB may include the base layer and the backplane structure, which are described above.

The bank pattern BNP may be disposed at a boundary between the first, second, and third pixels PXL1, PXL2, and PXL3 on the substrate SUB. For example, the bank pattern BNP may be disposed to surround each of the first, second, and third pixels PXL1, PXL2, and PXL3. Each of the first, second, and third pixels PXL1, PXL2, and PXL3 may be partitioned by the bank patterns BNP. The bank pattern BNP may protrude in a third direction DR3 from the substrate SUB.

The bank pattern BNP may include a first semiconductor layer B1, a second semiconductor layer B3 disposed on the first semiconductor layer B1, and an active layer B2 interposed between the first and second semiconductor layers B1 and B2.

The first semiconductor layer B1 of the bank pattern BNP may include, for example, at least one p-type semiconductor layer. For example, the first semiconductor layer B1 may have the same configuration as the first semiconductor layer 11 of the light emitting element described with reference to FIGS. 5 and 6.

The active layer B2 of the bank pattern BNP is disposed between the first semiconductor layer B1 and the second semiconductor layer B3, and may be formed in a single- or multi-quantum well structure. For example, the active layer B2 may have the same configuration as the active layer 12 of the light emitting element LD described with reference to FIGS. 5 and 6.

The second semiconductor layer B3 of the bank pattern BNP is disposed on the active layer B2, and may include a semiconductor layer having a type different from that of the first semiconductor layer B1. For example, the second semiconductor layer B3 may have the same configuration as the second semiconductor layer 13 of the light emitting element LD described with reference to FIGS. 5 and 6.

In some embodiments, the bank pattern BNP may further include a mask layer MK1 and MK2 disposed on the second semiconductor layer B3. The mask layer MK1 and MK2 may include a first mask layer MK1 disposed on the second semiconductor layer B3 and a second mask layer MK2 disposed on the first mask layer MK1. The first mask layer MK1 and the second mask layer MK2 may be sequentially stacked on the second semiconductor layer. The first mask layer MK1 and the second mask layer MK2 may be made of different materials. For example, the first mask layer MK1 may include silicon oxide ($SiO_x$), and the second mask layer MK2 may include nickel (Ni). However, the disclosure is not limited thereto.

The light emitting element LD may be disposed in each of the first to third pixels PXL1, PXL2, and PXL3. The light emitting element LD may be disposed between side surfaces of the bank pattern BNP on the substrate SUB. For example, the light emitting element LD may be surrounded by the bank pattern BNP.

Each of the light emitting elements LD may be provided in various shapes. For example, the light emitting element LD may have a rod-like shape or a bar-like shape, which is long in the third direction DR3 (i.e., its aspect ratio is greater than 1), but the disclosure is not limited thereto. For example, each of the light emitting elements LD may have a pillar shape in which a diameter of an end portion and a diameter of the other end portion are different from each other. Also, each of the light emitting elements LD may be a light emitting diode (LED) manufactured small enough to have a diameter and/or a length in the range of nanometers to micrometers. However, the disclosure is not limited thereto, and the size of the light emitting element LD may be variously changed to be suitable for requirements (or design conditions) of a lighting device or a display device, to which the light emitting element LD is applied.

The light emitting element LD may include a first semiconductor layer L1, a second semiconductor layer L3, and an active layer L2 interposed between the first and second semiconductor layers L1 and L3. For example, the first semiconductor layer L1, the active layer L2, and the second semiconductor layer L3 of the light emitting element LD may be sequentially stacked along the third direction DR3 on the substrate SUB.

The first semiconductor layer L1 of the light emitting element LD may include, for example, at least one p-type semiconductor layer. The active layer L2 of the light emitting element LD may be disposed between the first semiconductor layer L1 and the second semiconductor layer L3, and may be formed in a single- or multi-quantum well structure. The second semiconductor layer L3 of the light emitting element LD may be disposed on the active layer L2, and may include a semiconductor layer having a type different from that of the first semiconductor layer L1.

When a corresponding signal (or voltage) is applied to each of the end portions of the light emitting element LD, the light emitting element LD emits light as electron-hole pairs are combined in the active layer L2. The light emission of the light emitting element LD may be controlled in this manner, so that the light emitting element LD may be used as a light source (or light emitting source).

The first semiconductor layer L1, the active layer L2, and the second semiconductor layer L3 have been described in detail with reference to FIGS. 5 and 6, and therefore, the descriptions will not be repeated.

In an embodiment, the light emitting element LD and the bank pattern BNP may include a same material. For example, the first semiconductor layer L1, the active layer L2, and/or the second semiconductor layer L3 of the light emitting element LD may respectively include same materials as the first semiconductor layer B1, the active layer B2, and/or the third semiconductor layer B3 of the bank pattern BNP. The first semiconductor layer L1, the active layer L2, and/or the second semiconductor layer L3 of the light emitting element LD may be simultaneously formed respectively through the same processes as the first semiconductor layer B1, the active layer B2, and/or the third semiconductor layer B3 of the bank pattern BNP, simplifying the manufacturing process of the display device DD.

The light emitting element LD may be disposed on a first electrode ET1 provided (or disposed) on the substrate SUB. For example, the first semiconductor layer L1 of the light emitting element LD may be disposed on the first electrode ET1, to be electrically connected to the first electrode ET1. In an embodiment, the first electrode ET1 may be provided corresponding to an area in which the light emitting element LD is to be disposed on the substrate SUB. The first electrode ET1 may include a metal or metal oxide. For example, the first electrode ET1 may include copper (Cu), gold (Au), chromium (Cr), titanium (Ti), aluminum (Al), nickel (Ni), indium tin oxide (ITO), and any oxide or alloy thereof, but the disclosure is not limited thereto.

In an embodiment, connection electrodes CE1 and CE2 may be further provided between the substrate SUB and the light emitting element LD and/or bank pattern BNP. The connection electrodes CE1 and CE2 may include a first connection electrode CE1 provided between the light emitting element LD and the substrate SUB and a second connection electrode CE2 provided between the bank pattern BNP and the substrate SUB.

The first connection electrode CE1 may be disposed between the first semiconductor layer L1 of the light emitting element LD and the first electrode ET1. The light emitting element LD may be electrically connected to the first electrode ET1 provided on the substrate SUB through the first connection electrode CE1.

The second connection electrode CE2 and the first connection electrode CE1 may include a same material. For example, each of the first and second connection electrodes CE1 and CE2 may include a metal or metal oxide. For example, each of the first and second connection electrodes CE1 and CE2 may include copper (Cu), gold (Au), chromium (Cr), titanium (Ti), aluminum (Al), nickel (Ni), indium tin oxide (ITO), and any oxide or alloy thereof, but the disclosure is not limited thereto. The second connection electrode CE2 may be simultaneously formed with the first connection electrode CE1 through the same process as the first connection electrode CE1, but the disclosure is not limited thereto.

In an embodiment, a hard mask layer HM may be further disposed between the bank pattern BNP and the second connection electrode CE2. The hard mask layer may be disposed between the first semiconductor layer B1 of the bank pattern BNP and the second connection electrode CE2. The hard mask layer HM may be omitted in some embodiments.

In an embodiment, an insulative film INS may be provided, which covers at least a portion of a surface of the light emitting element LD and/or the bank pattern BNP. The insulative film INS may be provided to surround a side surface of the light emitting element LD and/or the bank pattern BNP. The insulative film INS may prevent electrical short circuits that may occur when the active layer L2 of the light emitting element LD contacts a conductive material other than the first and second semiconductor layers L1 and l3 of the light emitting element LD. Also, the insulative film INS minimizes surface defects in the light emitting element LD, thereby improving the lifetime and light emission efficiency of the light emitting element LD.

The insulative film INS covers the side surface of the light emitting element LD and/or the bank pattern BNP, and may be partially removed to expose a top surface of the light emitting element LD and/or the bank pattern BNP. For example, the second semiconductor layer L3 of the light emitting element LD may be exposed from the insulative film INS.

The insulative film INS may include silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), titanium oxide ($TiO_x$), or the like, but the disclosure is not limited thereto.

A second electrode ET2 may be disposed on the light emitting element LD. The second electrode ET2 may be disposed (e.g., directly disposed) on the top surface of each of the light emitting elements LD, which is exposed by the insulative film INS, and may contact the second semiconductor layer L3 of each of the light emitting elements LD. The second electrode ET2 may be disposed throughout the first to third pixels PXL1, PXL2, and PXL3. For example, the second electrode ET2 may be integrally formed on the substrate SUB to cover both the light emitting element LD and the bank pattern BNP.

The second electrode ET2 may be made of various transparent materials. For example, the second electrode ET2 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO), and be substantially transparent or translucent to satisfy a level of transmittance. Accordingly, light emitted from the light emitting elements LD may be emitted to the outside of a display panel while passing through the second electrode ET2.

The color conversion layer CCL may be disposed on the light emitting element LD. The color conversion layer CCL may be disposed between the bank patterns BNP. The color conversion layer CCL may be provided (or disposed) on the side surfaces of the bank patterns BNP and disposed on the light emitting element LD. The color conversion layer CCL may be provided in a space defined by the bank pattern BNP. For example, the color conversion layer CCL may fill a space between the bank pattern BNP and the light emitting element LD.

The color conversion layer CCL may include a quantum dot as a color conversion material for converting light emitted from the light emitting element LD into light of a different color. For example, the color conversion layer CCL may include quantum dots dispersed in a matrix material such as base resin.

In an embodiment, the first to third pixels PXL1, PXL2, and PXL3 may include light emitting elements LD emitting light of the same color. For example, the light emitting elements LD of each of the first to third pixels PXL1, PXL2, and PXL3 may emit blue light. The color conversion layer CCL may include a quantum dot for converting blue light emitted from the light emitting element LD, into light of another color (e.g., light of white). For example, the color conversion layer CCL may include a first quantum dot for converting the blue light emitted from the light emitting element LD, into red light and a second quantum dot for converting the blue light into green light, but the disclosure is not limited thereto. When a quantum dot is used as the color conversion material, blue light which had a relatively short wavelength in a visible light band is incident onto the quantum dot, so that the absorption coefficient of the quantum dot may be increased.

Accordingly, the efficiency of light finally emitted from the first to third pixels PXL1, PXL2, and PXL3, and color reproduction may be improved. The first to third pixels PXL1, PXL2, and PXL3 are implemented by using light emitting elements LD of the same color (e.g., blue light emitting elements), so that the manufacturing efficiency of the display device may be improved. However, the disclosure is not limited thereto, and the first to third pixels PXL1, PLX2, and PXL3 may include light emitting elements LD emitting lights of different colors. For example, the first pixel PXL1 may include a first color (or red) light emitting element LD, the second pixel PXLS may include a second color (or green) light emitting element LD, and the third pixel PXL3 may include a third color (or blue) light emitting element LD.

In an embodiment, a reflective member RF may be disposed between the bank pattern BNP and the color conversion layer CCL. The reflective member RF may reflect light emitted from the light emitting element LD, thereby improving the light emission efficiency of the display panel. Also, the reflective member RF may be disposed to cover at least a portion of the side surface of the bank pattern BNP, so that color mixture between adjacent pixels may be prevented. The material of the reflective member RF is not particularly limited, and the reflective member RF may be made of various reflective materials.

An encapsulation layer TFE may be disposed on the color conversion layer CCL. The encapsulation layer TFE may cover (e.g., directly cover) the color conversion layer CCL. The encapsulation layer TFE may be disposed throughout the first to third pixels PXL1, PXL2, and PXL3. The encapsulation layer TFE may prevent impurities such as moisture or air, which infiltrates from the outside, from damaging or contaminating the color conversion layer CCL and the light emitting element LD. In an embodiment, a surface of the encapsulation layer TFE may contact the color conversion layer CCL.

In an embodiment, the encapsulation layer TFE may include an organic material such as acryl resin, epoxy resin, phenolic resin, polyamides resin, polyimides resin, unsaturated polyesters resin, poly-phenylene ethers resin, polyphenylene sulfides resin, or benzocyclobutene (BCB), but the disclosure is not limited thereto.

In an embodiment, the encapsulation layer TFE may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

In an embodiment, the encapsulation layer TFE may have a multi-layer structure. For example, the encapsulation layer TFE may have a stack structure in which an inorganic material, an organic material, and an inorganic material are sequentially stacked.

The color filter layer CFL may be disposed on the encapsulation layer TFE. The color filter layer CFL may include a first color filter CF1, a second color filter CF2, and a third color filter CF3. In an embodiment, the first to third color filters CF1, CF2, and CF3 may respectively correspond to the first to third pixels PXL1, PXL2, and PXL3, and may be spaced apart from each other with respect to the bank pattern BNP.

The first to third color filters CF1, CF2, and CF3 may respectively correspond to colors of the first to third pixels PXL1, PXL2, and PXL3. The first color filter CF1 may allow light emitted from the first pixel PXL1 (e.g., the light emitting element LD of the first pixel PXL1) to be selectively transmitted therethrough. The second color filter CF2 may allow light emitted from the second pixel PXL2 (e.g., the light emitting element LD of the second pixel PXL2) to be selectively transmitted therethrough. The third color filter CF3 may allow light emitted from the third pixel PXL3 (e.g., the light emitting element LD of the third pixel PXL3) to be selectively transmitted therethrough.

In an embodiment, the first color filter CF1, the second color filter CF2, and the third color filter CF3 may be respectively a red color filter, a green color filter, and a blue color filter, but the disclosure is not limited thereto.

The first color filter CF1 may overlap the light emitting element LD of the first pixel PXL1 and the color conversion layer CCL in the third direction DR3. The first color filter CF1 may include a color filter material which allows light of a first color (or red) to be selectively transmitted therethrough. For example, when the first pixel PXL1 is a red pixel, the first color filter CF1 may include a red color filter material.

The second color filter CF2 may overlap the light emitting element LD of the second pixel PXL2 and the color conversion layer CCL in the third direction DR3. The second color filter CF2 may include a color filter material which allows light of a second color (or green) to be selectively transmitted therethrough. For example, when the second pixel PXL2 is a green pixel, the second color filter CF2 may include a green color filter material.

The third color filter CF3 may overlap the light emitting element LD of the third pixel PXL3 and the color conversion layer CCL in the third direction DR3. The third color filter CF3 may include a color filter material which allows light of a third color (or blue) to be selectively transmitted therethrough. For example, when the third pixel PXL3 is a blue pixel, the third color filter CF3 may include a blue color filter material.

In an embodiment, a touch sensor layer may be further provided between the color filter layer CFL and the encapsulation layer TFE. The touch sensor layer may include a conductive pattern for touch sensing and an insulating layer. The conductive pattern of the touch sensor layer may be configured as a single layer or a double layer with an insulating layer interposed therebetween.

In an embodiment, the meta structure layer MSL may be provided (or disposed) on the color filter layer CFL. The meta structure layer MSL may include a first meta structure MS1, a second meta structure MS2, and a third meta structure MS3. In an embodiment, the first to third meta structures MS1, MS2, and MS3 may respectively correspond to the first to third pixels PXL1, PXL2, and PXL3, and be provided while being spaced apart from each other with respect to the bank pattern BNP. For example, the first meta structure MS1 may be provided on the first color filter CF1, the second meta structure MS2 may be provided on the second color filter CF2, and the third meta structure MS3 may be provided on the third color filter CF3.

The meta structure layer MSL may include a meta surface made of a meta material. The characteristics (optical characteristics) of the meta structure MSL are not due to the constituting material, due to its structure. The optical characteristics of the meta structure MSL is determined by the geometric structure, size, direction, and arrangement of the meta material. The meta structure layer MSL may have characteristics including negative refraction, super-resolution imaging, perfect absorption, cloaking, and the like. These characteristics may be difficult to achieve with existing natural materials.

A meta surface structure of the meta structure MSL may be implemented with a material having a meta-atom. For example, the size of the meta-atom is considerably smaller than the wavelength of the meta-atom, and may be designed to control fundamental properties such as permittivity and permeability rather than refractive index. The meta surface may serve as a meta lens for changing an optical path.

In an embodiment, as shown in FIGS. 8, 9A, 9B, and 9C, the meta structure layer MSL may include a transparent base layer BL and a nano optical pattern NS provided or disposed (e.g., directly provided or directly disposed) on the transparent base layer BL.

The transparent base layer BL may be provided (or disposed) on the color filter layer CFL. The transparent base layer BL may be implemented as a glass substrate, a quartz substrate, a glass ceramic substrate, a crystalline glass substrate, or the like. In another example, the transparent base layer BL may be implemented as a polymer organic substrate including polyimide, polyamide or the like, a plastic substrate, etc. In an embodiment, the transparent base layer BL may be provided as a pattern including islands, corresponding to the first to third color filters CF1, CF2, and CF3.

The nano optical pattern NS may be provided or disposed (e.g., directly provided or directly disposed) on the transparent base layer BL. The nano optical pattern NS may be formed to the meta surface structure. For example, the nano optical pattern NS may be formed with a width, a thickness, an interval, and a pitch in the range of nanometers, to form the meta surface made of a meta material.

In some embodiments, the nano optical pattern NS may be arranged similarly to the planar shape of an emission surface (emission area) of the pixel. For example, as shown in FIG. 9A, the nano optical pattern NS may be arranged on a circular base layer BL. For example, the meta surface caused by the nano optical pattern NS may serve as a meta lens. In other embodiments, as shown in FIGS. 9B and 9C, the nano optical pattern NS may be arranged on a quadrangular base layer BL.

In an embodiment, as shown in FIGS. 9A and 9B, the nano optical pattern NS may be radially formed with respect to a center point. In other embodiments, as shown in FIG. 9C, the nano optical pattern NS may be arranged in rows and/or columns.

However, the embodiments are not limited thereto, and the arrangement, form, etc. of the nano optical pattern NS may be variously designed according to the purpose, function, etc. of the meta surface.

In an embodiment, the nano optical pattern NS may include a transparent conductive material. For example, the nano optical pattern NS may include at least one of indium tin oxide (ITO), indium zinc oxide (IZO), Ga—In—Zn oxide (GIZO), Al—Zn oxide (AZO), Ga—Zn oxide (GZO), and ZnO, which are transparent conductive oxides. However, the embodiments are not limited thereto, and the nano-optical pattern NS may include at least one of crystalline silicon (c-Si), poly-silicon (p-Si), amorphous silicon (a-Si), and III-V compound semiconductors (GaAs, GaP, GaN, GaAs, etc.), silicon carbide (SiC), and silicon nitride (SiN).

The nano optical pattern NS may include a first meta surface NS1, a second meta surface NS2, and a third meta surface NS3 (refer to FIG. 8). The first meta structure MS1 including the first meta surface NS1 may overlap the first pixel PXL1, the second meta structure MS2 including the second meta surface NS2 may overlap the second pixel PXL2, and the third meta structure MS3 including the third meta surface NS3 may overlap the third pixel PXL3.

In an embodiment, shapes and arrangements of the first meta surface NS1, the second meta surface NS2, and the third meta surface NS3 may be respectively set corresponding to a red wavelength band, a green wavelength band, and a blue wavelength band. For example, at least one of the first meta surface NS1, the second meta surface NS2, and the third meta surface NS3 may improve out-coupling (or out-coupling efficiency) of light provided (emitted) from the color filter layer CFL, thereby increasing the light emission efficiency (or intensity of light).

In other embodiments, at least one of the first meta surface NS1, the second meta surface NS2, and the third meta surface NS3 may serve as the meta lens, thereby converging or deflecting the direction of light provided (emitted) from the color filter layer CFL to a set direction, or emitting/diffusing the light according to purposes of the display device. Accordingly, color mixture defects of light, etc. may be reduced, and image quality may be improved.

In an embodiment, an additional protective layer (not shown) may be provided on the color filter layer CFL and the meta structure MSL. The protective layer may cover a lower member including the color filter layer CFL and the meta structure MSL. The protective layer may prevent moisture or air from infiltrating into the lower member. Also, the protective layer may protect the lower member from a foreign matter such as dust.

As described above, the display device DD in accordance with the embodiments of the disclosure includes the meta structure layer MSL provided on the color filter layer CFL, so that the light emission efficiency of light (the intensity of light) emitted from the pixels PXL1, PXL2, and PXL3 may be improved, or the light distribution of the emitted light may be adaptively controlled by controlling the convergence, deflection, diffusion, and polarization of the emitted light to according to the design requirements. Accordingly, the image quality of the display device DD may be improved. The bank patterns BNP of the light emitting element LD are simultaneously formed, and the color conversion layer CCL is filled between the bank patterns BNP, so that the manufacturing process of the display device DD may be simplified, and the thickness of the display device DD may be decreased.

Figure 10:
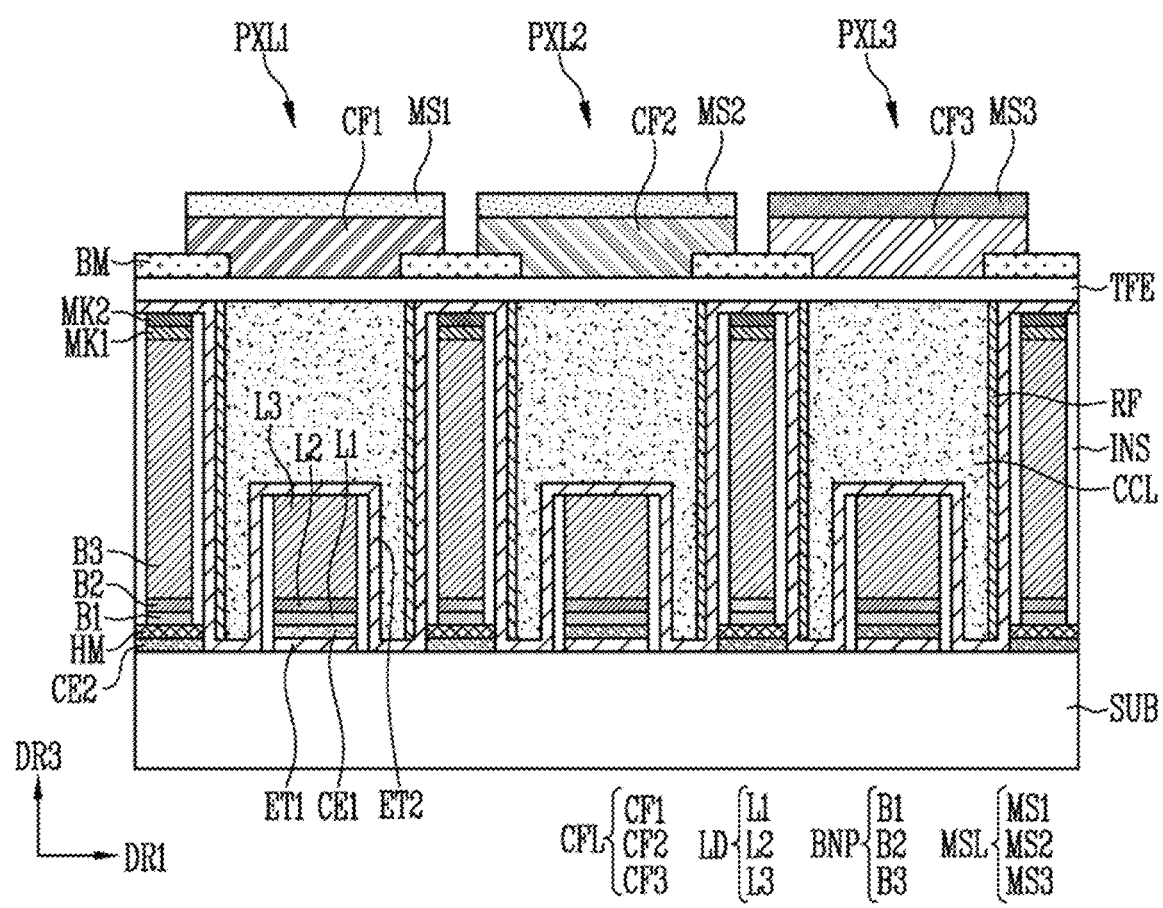
FIG. 10 is a schematic cross-sectional view illustrating an example of the display device shown in FIG. 1.

FIG. 10 is a schematic cross-sectional view illustrating an example of the display device shown in FIG. 1.

In FIG. 10, components identical to those described with reference to FIG. 7 are designated by like reference numerals, and their descriptions will not be repeated. The display device shown in FIG. 10 may substantially identical or similar to the display device shown in FIG. 7, except for the light blocking pattern BM.

Referring to FIG. 10, the display device having first to third pixels PXL1, PXL2, and PXL3 may include a substrate SUB, and bank patterns BNP, a light emitting element LD, a color conversion layer CCL, a color filter layer CFL, a meta structure layer MSL, and the light blocking pattern BM.

The light blocking pattern BM may be provided above the bank patterns BNP, to overlap the bank patterns BNP in the third direction DR3. Also, the light blocking pattern BM may be provided between first to third color filters CF1, CF2, and CF3.

In an embodiment, the light blocking pattern BM may be formed to be patterned on an encapsulation layer TFE. The light blocking pattern BM may be disposed on the encapsulation layer. The color filter layer CFL and the meta structure layer MSL may be disposed to cover a portion of a top surface of the light blocking pattern BM. The color filter layer CFL may contact the top surface of the light blocking pattern BM. For example, the color filter layer CFL may contact the top surface of the light blocking pattern BM.

The light blocking pattern BM may absorb or block light introduced from the outside and/or light emitted from the bottom thereof. As described above, when the light blocking pattern BM is formed between the color filters CF1, CF2, and CF3, a color mixture defect viewed from the front or side of the display device DD may be more effectively reduced.

Figure 11:
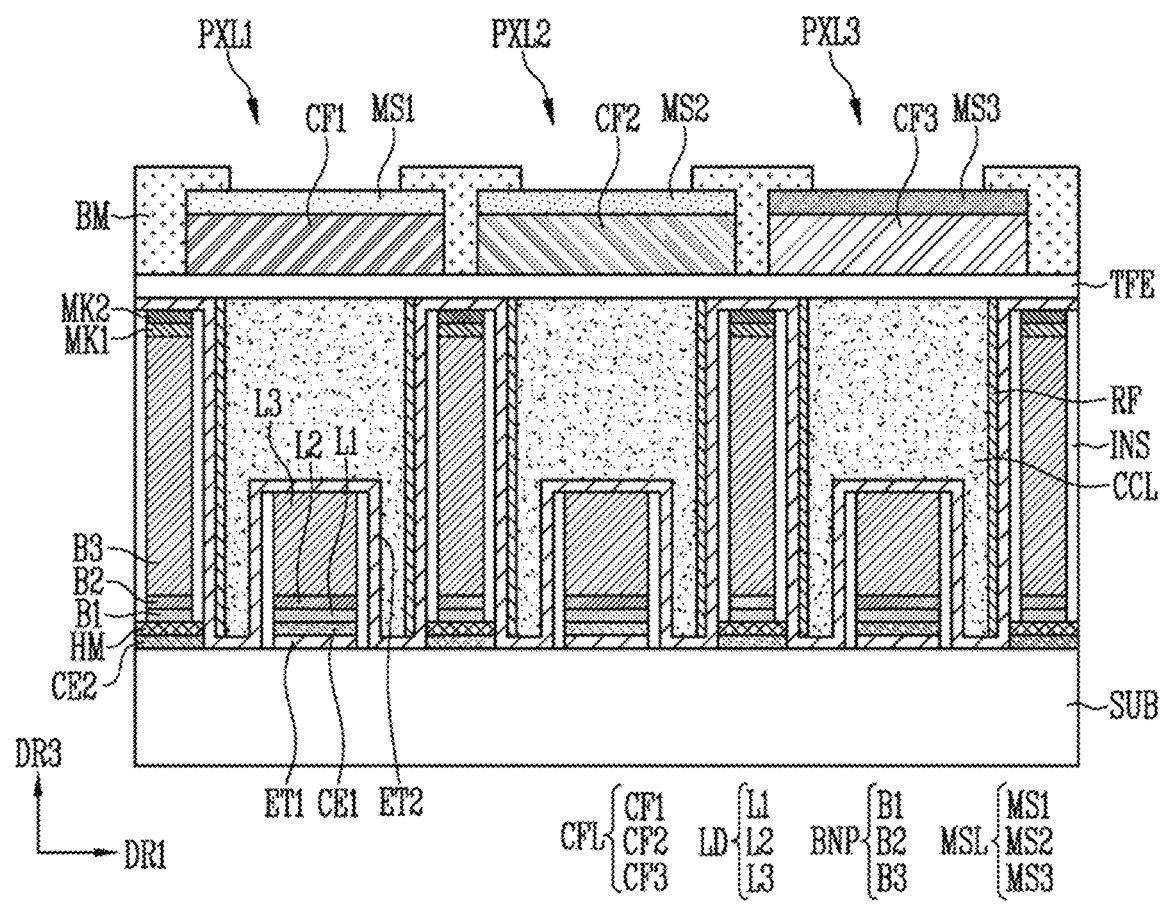
FIG. 11 is a schematic cross-sectional view illustrating an example of the display device shown in FIG. 1.

FIG. 11 is a schematic cross-sectional view illustrating an example of the display device shown in FIG. 1.

In FIG. 11, components identical to those described with reference to FIG. 10 are designated by like reference numerals, and their descriptions will not be repeated. The display device shown in FIG. 11 may be configured substantially identical or similar to the display device shown in FIG. 10, except for the light blocking pattern BM.

Referring to FIG. 10, the display device having first to third pixels PXL1, PXL2, and PXL3 may include a substrate SUB, and bank patterns BNP, a light emitting element LD, a color conversion layer CCL, a color filter layer CFL, a meta structure layer MSL, and the light blocking pattern BM.

In an embodiment, the light blocking pattern BM may be disposed at boundaries between the first to third pixels PXL1, PXL2, and PXL3. For example, the light blocking pattern BM may be provided (or disposed) above the bank patterns BNP, to overlap the bank patterns BNP in the third direction DR3. Also, the light blocking pattern BM may be provided between first to third color filters CF1, CF2, and CF3.

In an embodiment, the light blocking pattern BM may be formed to be patterned on the color filter layer CFL and the meta structure layer MSL. The light blocking pattern BM may contact side surfaces of the color filter layer CFL and the meta structure layer MSL. Also, the light blocking pattern BM may be provided (or disposed) on a portion of a top surface of the meta structure layer MSL. The light blocking pattern BM may absorb or block light introduced from the outside and/or light emitted from the bottom thereof.

Figure 12:
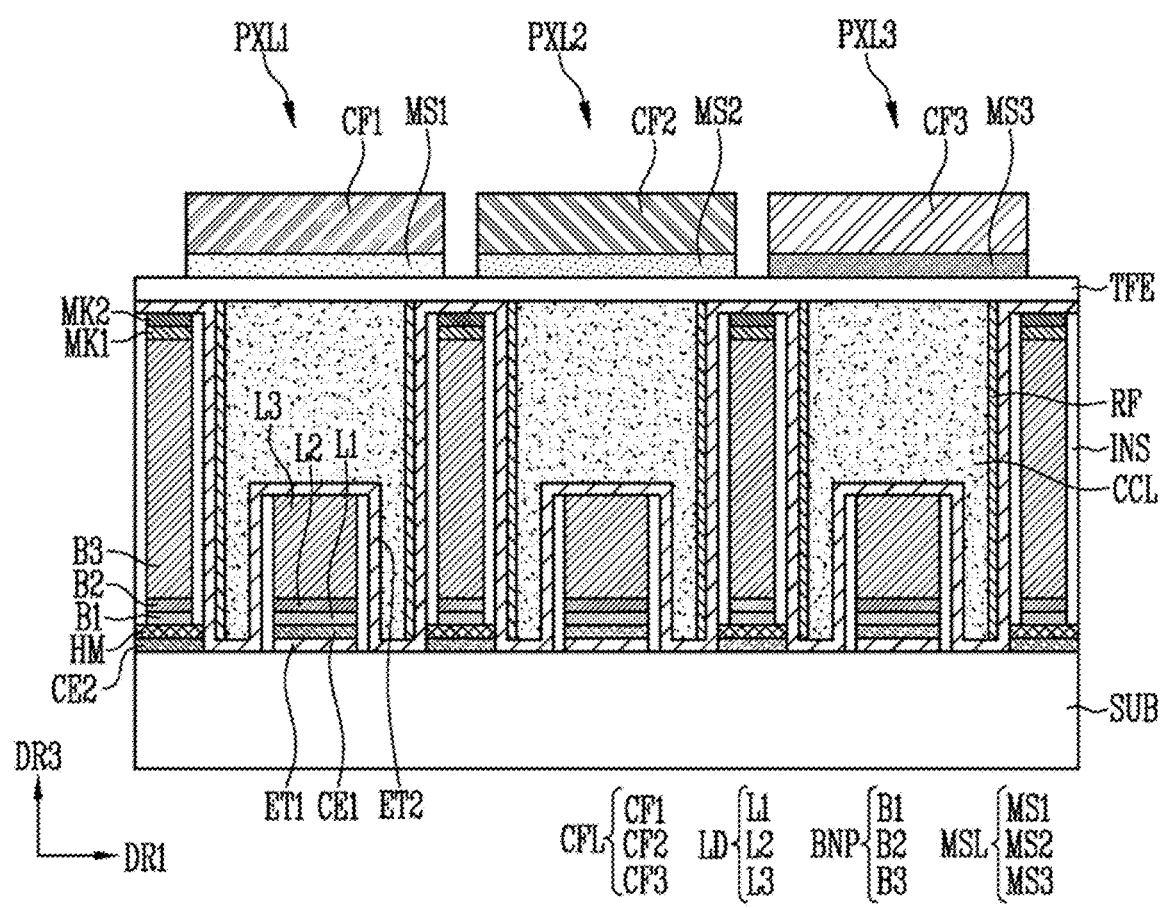
FIG. 12 is a schematic cross-sectional view illustrating an example of the display device shown in FIG. 1.
Figure 13:
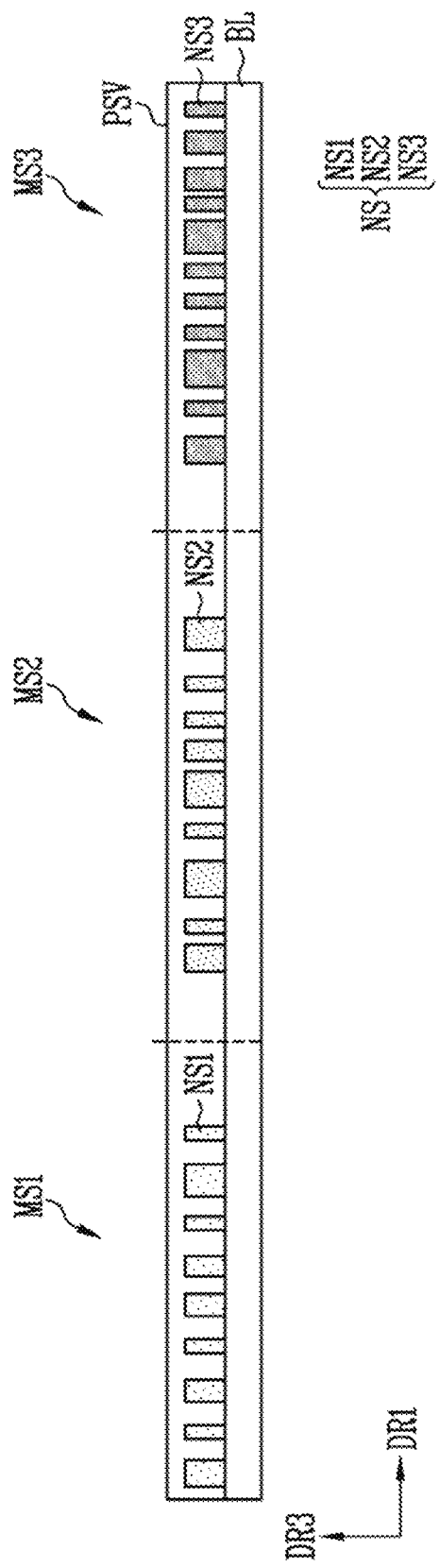
FIG. 13 is a schematic cross-sectional view illustrating an example of a meta structure included in the display device shown in FIG. 12.

FIG. 12 is a schematic cross-sectional view illustrating an example of the display device shown in FIG. 1. FIG. 13 is a schematic cross-sectional view illustrating an example of a meta structure included in the display device shown in FIG. 12.

In FIGS. 12 and 13, components identical to those described with reference to FIGS. 7 and 8 are designated by like reference numerals, and their descriptions will not be repeated. The display device shown in FIGS. 12 and 13 may be substantially identical or similar to the display device shown in FIGS. 7 and 8, except for the position and configuration of a meta structure layer MSL.

Referring to FIGS. 12 and 13, the display device having first to third pixels PXL1, PXL2, and PXL3 may include a substrate SUB, and bank patterns BNP, a light emitting element LD, a color conversion layer CCL, a color filter layer CFL, the meta structure layer MSL, and a light blocking pattern BM.

In an embodiment, the meta structure layer MSL may include a transparent base layer BL provided on an encapsulation layer TFE and a nano optical pattern NS provided (or disposed) on the transparent base layer BL.

The transparent base layer BL and the encapsulation layer TFE may be integral with each other. The nano optical pattern NS may include first to third meta surfaces NS1, NS2, and NS3 respectively corresponding to the first to third pixels PXL1, PXL2, and PXL3. The first to third meta structures MS1, MS2, and MS3 may be respectively defined by the first to third meta surfaces NS1, NS2, and NS3.

In an embodiment, as shown in FIG. 13, a protective layer PSV may be provided (or disposed) on the first to third meta surfaces NS1, NS2, and NS3 and the transparent base layer BL. The protective layer PSV may protect the first to third meta surfaces NS1, NS2, and NS3 from damage or contamination. The protective layer PSV may include a transparent inorganic insulating material or a transparent organic insulating material.

The color filter layer CFL may be provided (or disposed) on the protective layer PSV. A first color filter CF1 may overlap the first meta surface NS1 defining the first meta structure MS1. A second color filter CF2 may overlap the second meta surface NS2 defining the second meta structure MS2. A third color filter CF3 may overlap the third meta surface NS3 defining the third meta structure MS3. The meta structure layer MSL is disposed between the encapsulation layer TFE and the color filter layer CFL.

Although not shown in FIG. 12, the display device may further include the light blocking pattern described with reference to FIGS. 10 and 11.

As described above, the meta structure layer MSL is disposed closer to a light source (light emitting element LD), so that light emission efficiency may be further improved. Accordingly, light distribution control may be easier.

Figure 14:
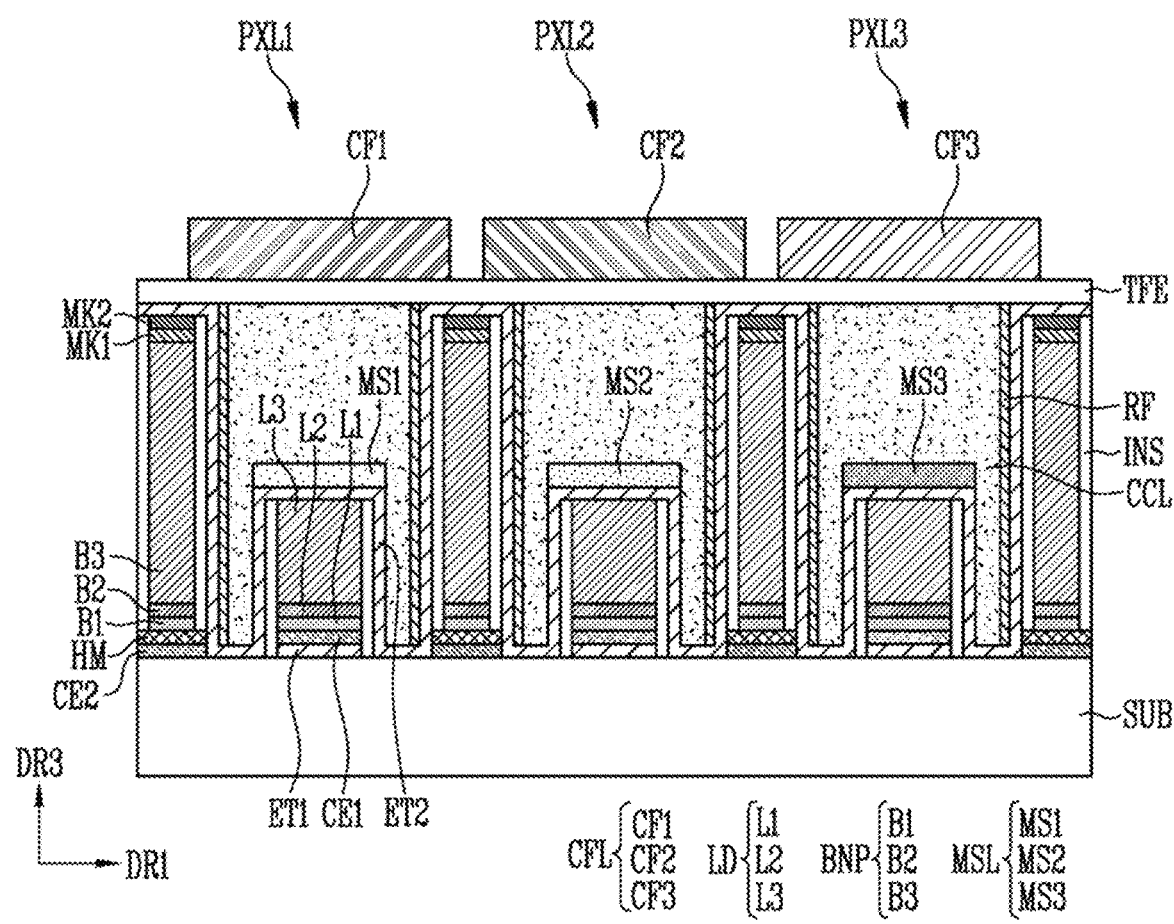
FIG. 14 is a schematic cross-sectional view illustrating an example of the display device shown in FIG. 1.

FIG. 14 is a schematic cross-sectional view illustrating an example of the display device shown in FIG. 1.

In FIG. 14, components identical to those described with reference to FIGS. 7 and 8 are designated by like reference numerals, and their descriptions will not be repeated. The display device shown in FIG. 14 may be configured substantially identical or similar to the display device shown in FIGS. 7 and 8, except for the position of a meta structure layer MSL.

Referring to FIGS. 8 and 14, the display device having first to third pixels PXL1, PXL2, and PXL3 may include a substrate SUB, and bank patterns BNP, a light emitting element LD, a color conversion layer CCL, a color filter layer CFL, and the meta structure layer MSL.

The meta structure layer MSL may include first to third meta structures MS1, MS2, and MS3 respectively corresponding to the first to third pixels PXL1, PXL2, and PXL3.

In an embodiment, each of the first to third meta structures MS1, MS2, and MS3 may include a transparent base layer provided or disposed (e.g., directly provided or directly disposed) on a second electrode ET2 and a nano optical pattern provided (or disposed) on the transparent base layer.

In an embodiment, a protective layer for protecting meta surfaces may be further provided on the nano optical pattern.

The color conversion layer CCL may be provided while covering each of the first to third meta structures MS1, MS2, and MS3. The meta structures MS1, MS2, and MS3 may contact the color conversion layer CCL. The meta structure layer MSL may be disposed on the light emitting element LD, and the color conversion layer CCL may cover the meta structure layer MSL.

As described above, the meta structure layer MSL is provided in the color conversion layer CCL, so that the thickness of the display device may be further decreased.

Although not shown in FIG. 14, the display device may further include the light blocking pattern BM described with reference to FIGS. 10 and 11.

FIGS. 15A to 15I are schematic cross-sectional views illustrating a manufacturing method of a display device in accordance with embodiments of the disclosure.

In FIGS. 15A to 15I, components identical to those described with reference to FIGS. 7 to 14 are designated by like reference numerals, and their descriptions will not be repeated.

Referring to FIGS. 15A to 15I, in the manufacturing method of the display device, a light emitting element LD and bank patterns BNP may be formed on a substrate SUB through the same process, and then an encapsulation layer TFE and a color filter layer CFL are sequentially formed.

The substrate SUB may be a driving substrate including a circuit element, and the like, including transistors constituting the pixel circuit (PXC shown in FIG. 4A or 4B) of each of first to third pixels PXL1, PXL2, and PXL3.

Figure 15A:
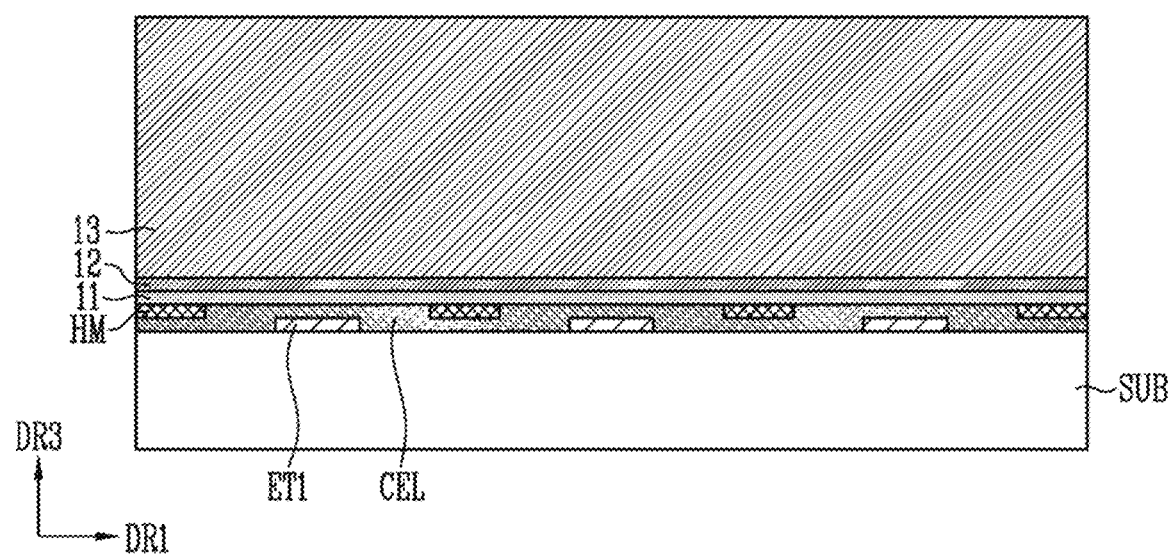
FIGS. 15A to 15I are schematic cross-sectional views illustrating a manufacturing method of a display device in accordance with embodiments.

As shown in FIG. 15A, a first electrode ET1, a connection electrode layer CEL, and/or a hard mask layer BM may be provided to be patterned on the substrate SUB. A light emitting stack structure 11, 12, and 13 may be provided on the substrate SUB on which the first electrode ET1, the connection electrode layer CEL, and/or the hard mask layer BM are formed.

The first electrode ET1 may be formed at positions at which light emitting elements LD are to be provided. The connection electrode layer CEL may be formed throughout the entire surface of the substrate SUB, but the disclosure is not limited thereto. The hard mask layer HM may be formed at a position at which the bank pattern BNP is to be provided, to form a bottom end of the bank patterns BNP. However, the disclosure is not limited thereto, and the hard mask layer HM may be omitted in some embodiments.

The light emitting stack structure 11, 12, and 13 may be provided on the substrate SUB on which the first electrode ET1, the connection electrode layer CEL, and/or the hard mask layer HM are formed. The light emitting stack structure 11, 12, and 13 may be formed by growing a seed crystal through an epitaxial process.

In an embodiment, the light emitting stack structure 11, 12, and 13 may be formed through metal organic chemical vapor deposition (MOCVD). However, the disclosure is not limited thereto, and the light emitting stack structure 11, 12, and 13 may be formed through various other processes such as electron-beam deposition, physical vapor deposition (PVD), chemical vapor deposition (CVD), plasma laser deposition (PLD), dual-type thermal evaporation, sputtering, and metal organic chemical vapor deposition (MOCVD).

The light emitting stack structure 11, 12, and 13 may include a first semiconductor layer 11, an active layer 12, and a second semiconductor layer, which are epitaxially grown. The first semiconductor layer 11, the active layer 12, and the second semiconductor layer 13 may be sequentially provided along the third direction DR3 on the substrate SUB.

The configuration of the first semiconductor layer 11, the active layer 12, and the second semiconductor layer 13 has been described above with reference to FIGS. 5 and 6, and their descriptions will not be repeated.

Figure 15B:
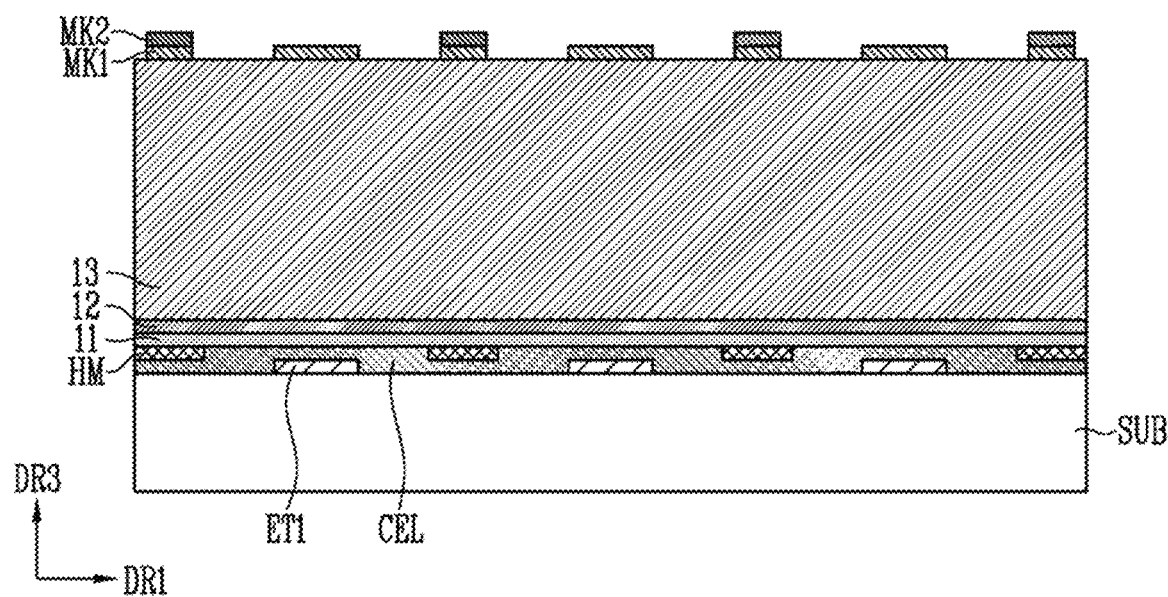

As shown in FIG. 15B, first and second mask layers MK1 and MK2 may be formed on the light emitting stack structure 11, 12, and 13.

The first mask layer MK1 may be partially formed at positions at which the light emitting element LD and the bank pattern BNP are to be provided. The second mask layer MK2 may be formed on the first mask layer MK1. The second mask layer MK2 may be formed at a position at which the bank pattern BNP is to be provided.

The first mask layer MK1 and the second mask layer MK2 may be made of different materials. For example, the first mask layer MK1 may include silicon oxide (SiO$_x$), and the second mask MK2 may include nickel (Ni). However, the disclosure is not limited thereto.

Figure 15C:
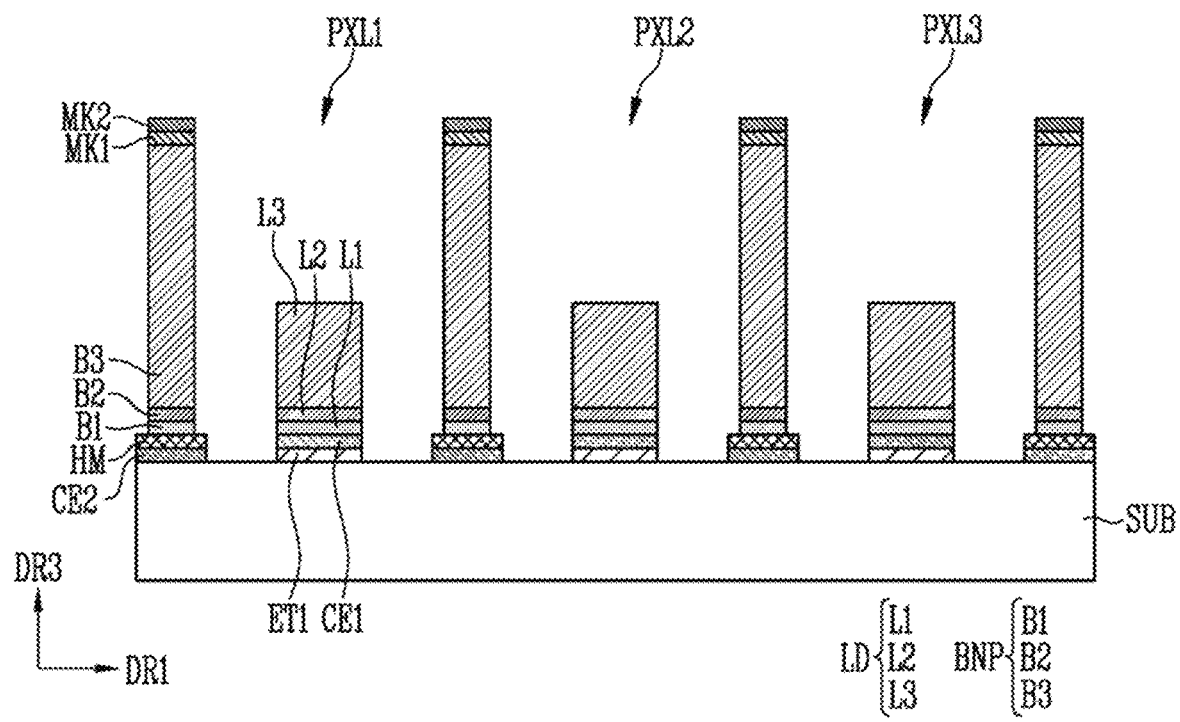

As shown in FIG. 15C, the light emitting element LD and the bank pattern BNP may be formed by etching the light emitting stack structure 11, 12, and 13. The bank pattern BNP may be formed at boundaries between the first to third pixels PXL1, PXL2, and PXL3. The light emitting element LD may be formed in each of the first to third pixels PXL1, PXL2, and PXL3 between the bank patterns BNP.

The light emitting element LD and the bank pattern BNP, which have different thicknesses, may be formed substantially simultaneously by using a first mask layer MK1 that has a different etch selectivity than the second mask layer MK2 when etching the light emitting stack structure 11, 12, and 13.

In an embodiment, the connection electrode layer CEL may be separated into a first connection electrode CE1 and the second connection electrode CE2 in the process of etching the light emitting stack structure 11, 12, and 13. For example, the connection electrode layer CEL may be separated into the first connection electrode CE1 on the bottom of the light emitting element LD and the second connection electrode CE2 on the bottom of the hard mask layer HM.

Figure 15D:
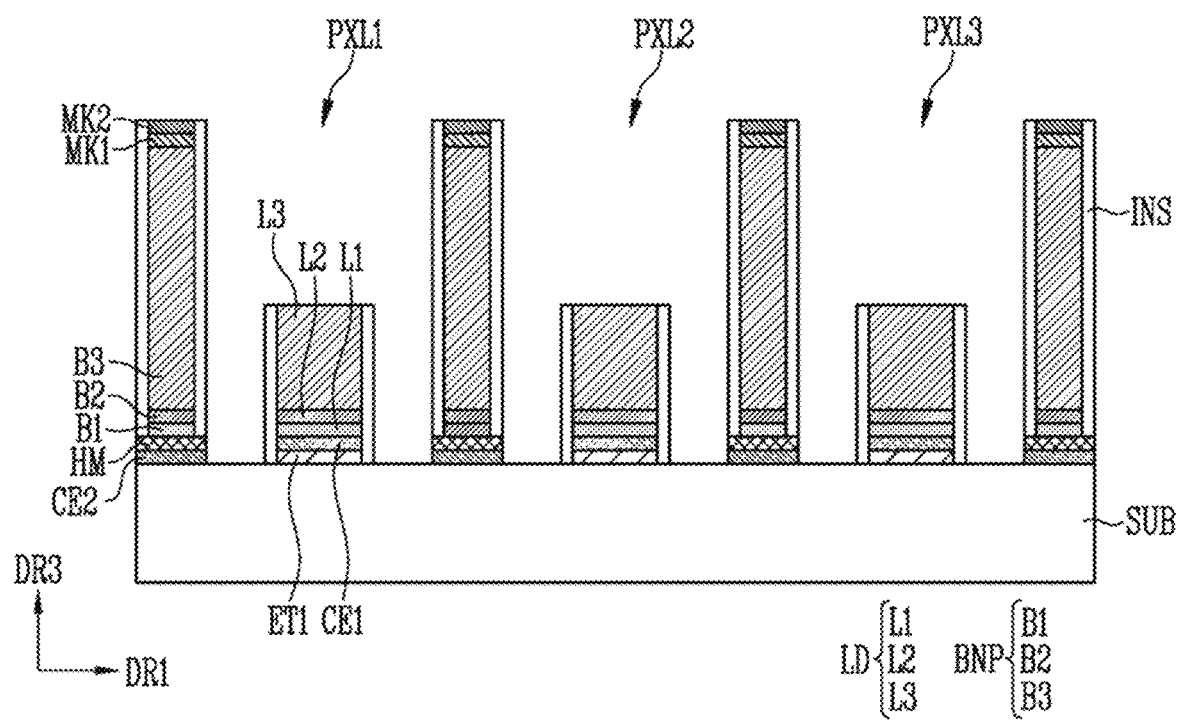

As shown in FIG. 15D, subsequently, an insulative film INS may be formed, which covers at least a portion of the light emitting element LD and/or the bank pattern BNP. For example, the insulative film INS may be partially formed on a side surface of the light emitting element LD and/or the bank pattern BNP.

The insulative film INS may be partially removed such that a top surface of the light emitting element LD and/or the bank pattern BNP is exposed after the insulative film INS are integrally formed throughout the first to third pixels PXL1, PXL2, and PXL3. In an embodiment, when the light emitting element LD and/or the bank pattern BNP are formed in the third direction DR3 with respect to the substrate SUB, the insulative film INS provided on the top surface of the light emitting element LD and/or bank patterns BNP may be removed without any separate mask in etching of the insulative film INS.

Figure 15E:
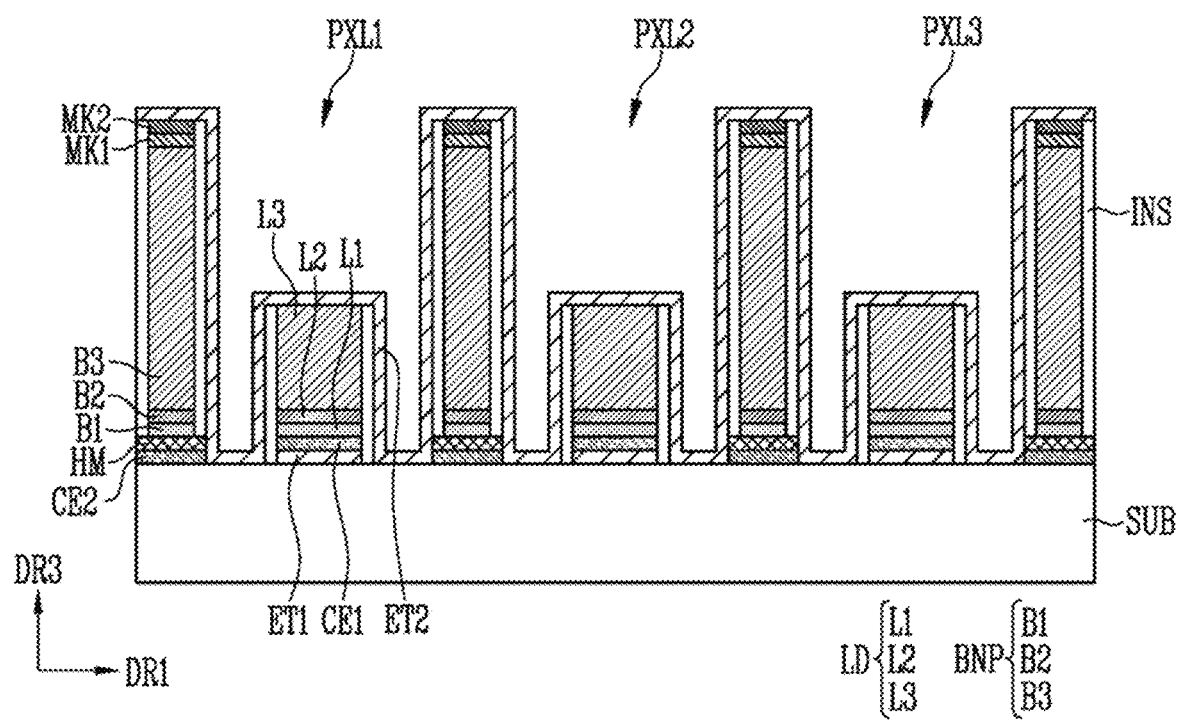

As shown in FIG. 15E, a second electrode ET2 may be formed on the light emitting element LD. The second electrode ET2 may be formed (e.g., directly formed) on the top surface of the light emitting element LD, which is exposed by the insulative film INS, to contact a second semiconductor layer L3 of each of the light emitting elements LD.

The second electrode ET2 may be integrally formed throughout the first to third pixels PXL1, PXL2, and PXL3. The second electrode ET2 may partially cover the bank pattern BNP. The second electrode ET2, the light emitting element LD, and the bank pattern BNP may be integral with each other. However, the disclosure is not limited thereto.

The second electrode ET2 may be made of various transparent materials. For example, the second electrode ET2 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO), and may be substantially transparent or translucent to satisfy a level of transmittance. Accordingly, light emitted from the light emitting elements LD may be emitted to the outside of a display panel while passing through the second electrode ET2.

In an embodiment, as shown in FIG. 14, first to third meta structures MS1, MS2, and MS3 respectively corresponding to the first to third pixels PXL1, PXL2, and PXL3 may be formed on the second electrode ET2 formed on the second electrodes LD. A method of forming the first to third meta structures has been described above with reference to FIGS. 7 to 9C, and their descriptions will not be repeated.

Figure 15F:
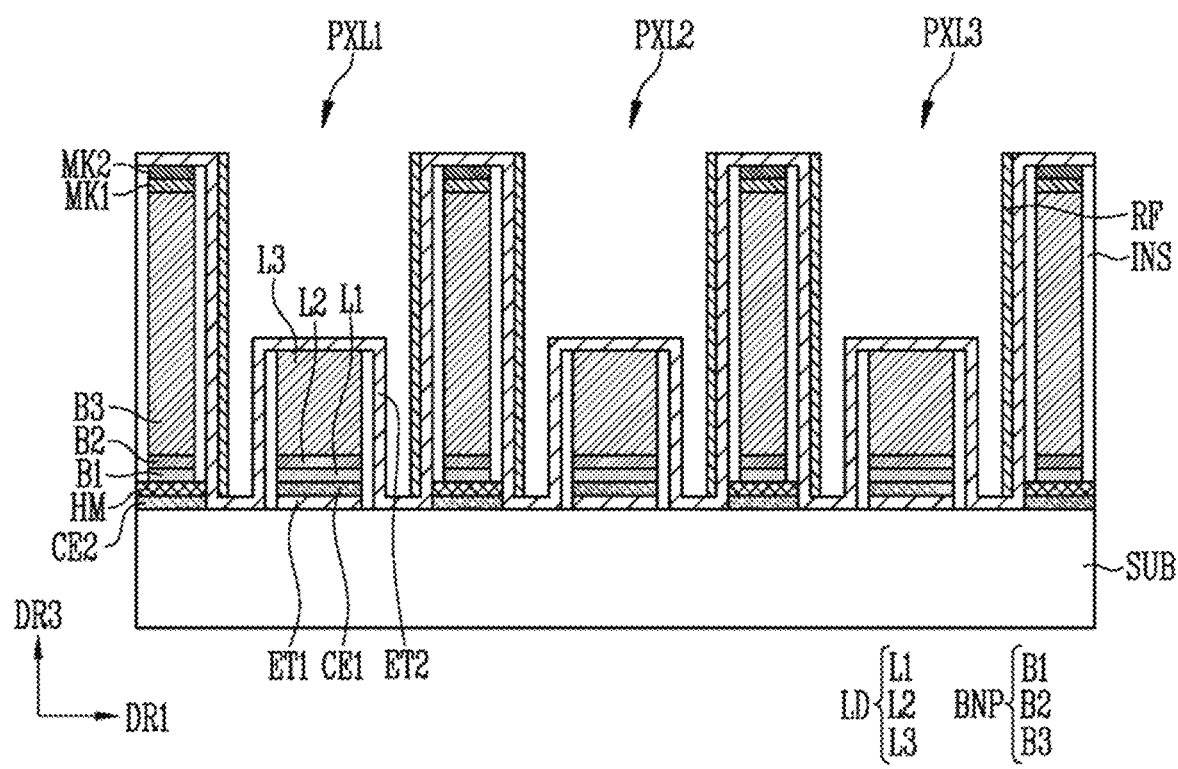

As shown in FIG. 15F, a reflective member RF may be formed, which covers a portion of the bank pattern BNP. In an embodiment, the reflective member RF may be partially formed to surround a side surface of the bank pattern BNP.

The reflective member RF may reflect light emitted from the light emitting element LD (in a display direction), thereby improving the light emission efficiency of the display panel. Also, the reflective member RF may be disposed on the side surface of the bank pattern BNP, to prevent color mixture between adjacent pixels. The material of the reflective member RF is not particularly limited, and may be formed of various reflective materials.

Figure 15G:
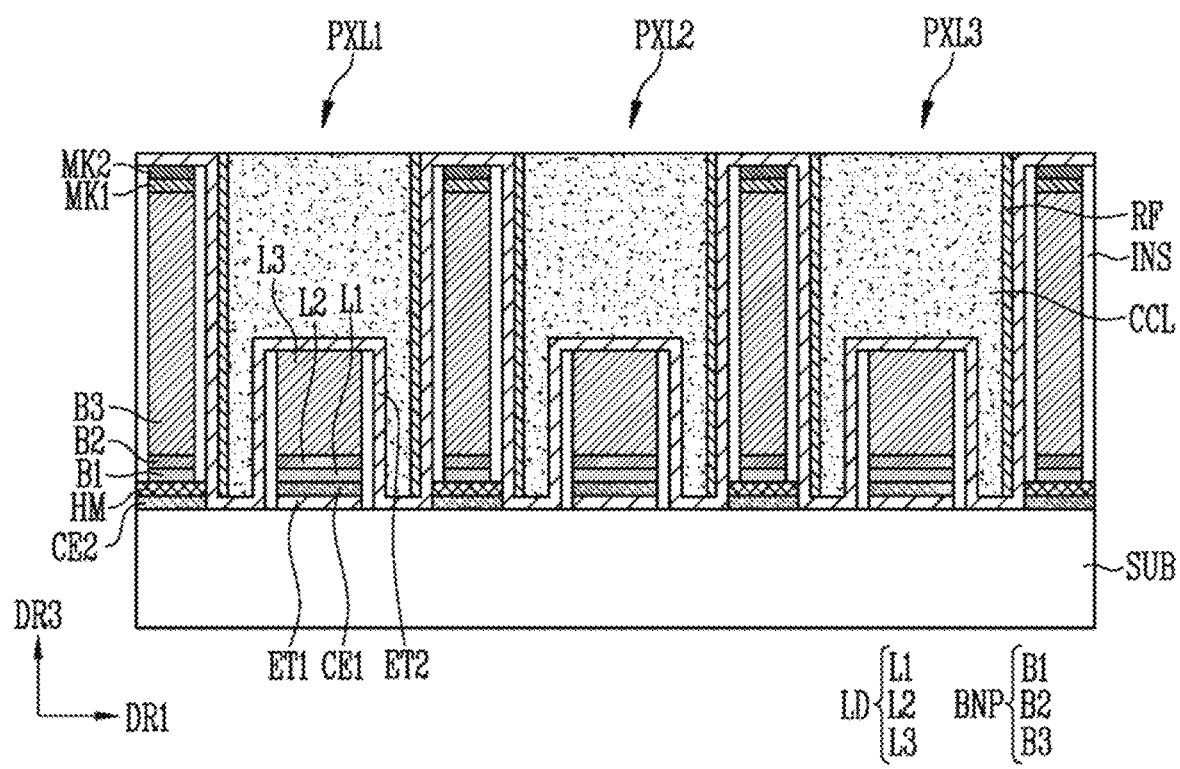

As shown in FIG. 15G, a color conversion layer CCL may be formed on the light emitting element LD. The color conversion layer CCL may be formed between the bank patterns BNP. The color conversion layer CCL may be formed in a space or an opening, which is defined by the bank patterns BNP.

The color conversion layer CCL may include a quantum dot as a color conversion material for converting light emitted from the light emitting element LD of each of the pixels PXL1, PXL2, and PXL3 into light of a different color. The color conversion layer CCL has been described in detail with reference to FIG. 7, and their descriptions will not be repeated.

Figure 15H:
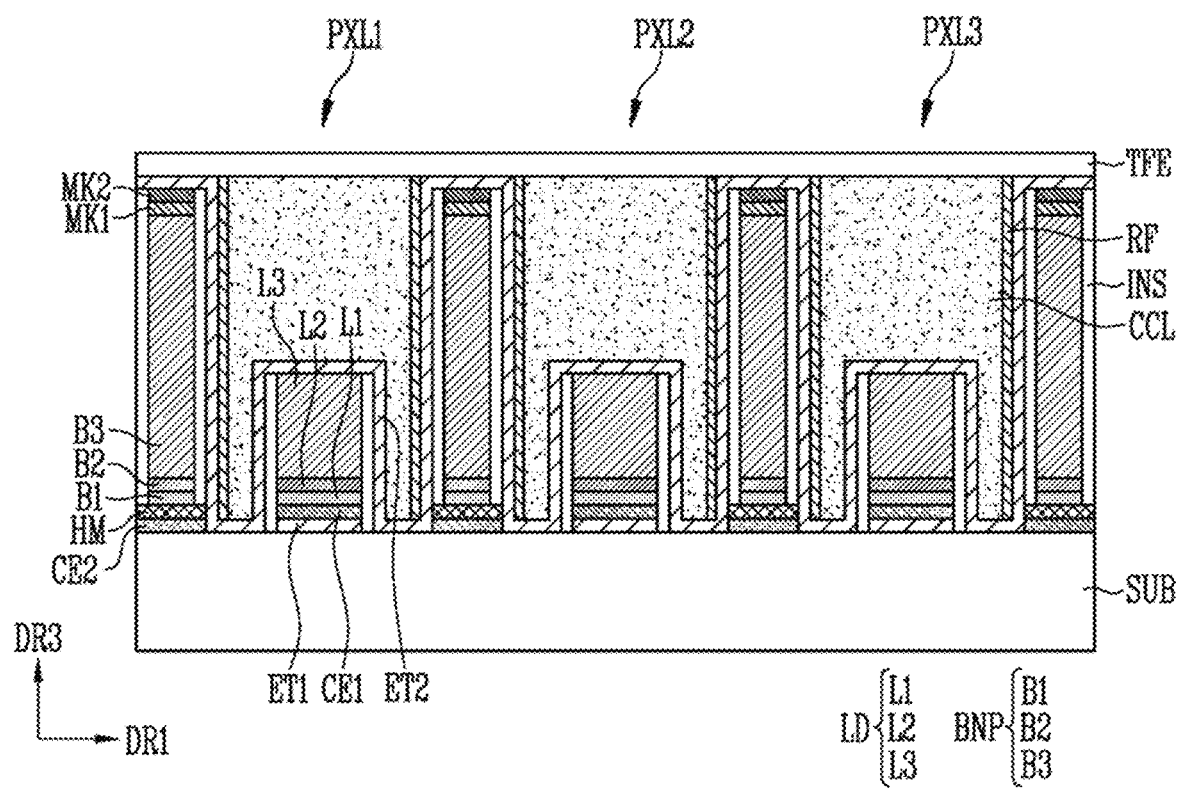

As shown in FIG. 15H, the encapsulation layer TFE may be formed on the color conversion layer CCL and the bank pattern BNP. The encapsulation layer TFE may be disposed through the first to third pixels PXL1, PXL2, and PXL3.

The encapsulation layer TFE may be formed through a process of forming an inorganic insulating layer or an organic insulating layer.

In an embodiment, the encapsulation layer TFE may be provided as a multi-layer structure. For example, the encapsulation layer TFE may have a stack structure in which an inorganic material, an organic material, and an inorganic material are sequentially deposited.

Figure 15I:
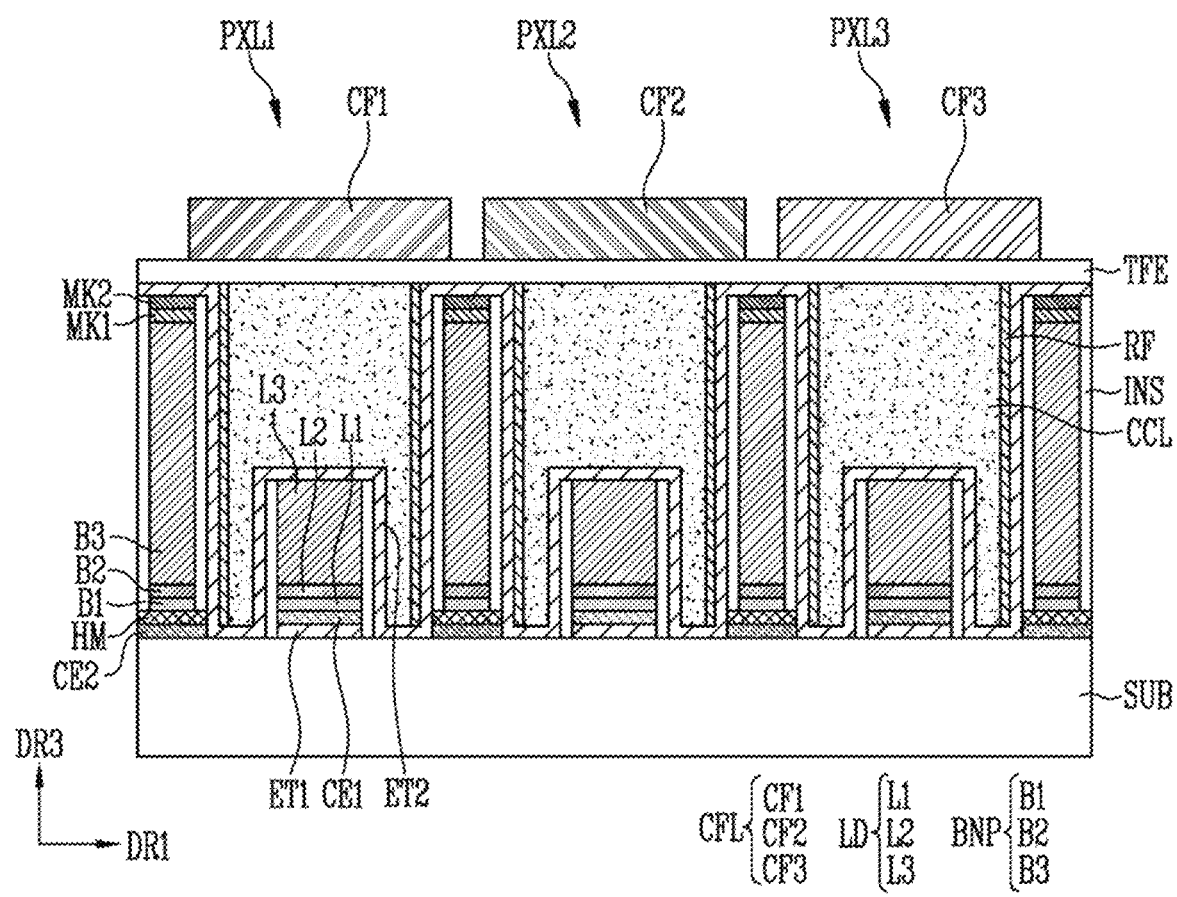

As shown in FIG. 15I, the color filter layer CFL including first to third color filters CF1, CF2, and CF3 may be formed on the encapsulation layer TFE. In an embodiment, the first to third color filters CF1, CF2, and CF3 may respectively correspond to the first to third pixels PXL1, PXL2, and PXL3, and be provided to be spaced apart from each other with respect to the bank pattern BNP. For example, the first to third color filters CF1, CF2, and CF3 may be sequentially patterned on the encapsulation layer TFE.

In an embodiment, as shown in FIG. 12, the first to third meta structures MS1, MS2, and MS3 respectively corresponding to the first to third pixels PXL1, PXL2, and PXL3 may be formed on the encapsulation layer TFE before the color filter layer CFL is formed.

In another embodiment, as shown in FIGS. 7, 10, and 11, the first to third meta structures MS1, MS2, and MS3 respectively corresponding to the first to third pixels PXL1, PXL2, and PXL3 may be formed on the color filter layer CFL.

A method of forming the first to third meta structures has been described above with reference to FIGS. 7 to 9C and 13, and therefore, descriptions of overlapping portions will not be repeated.

Figure 16:
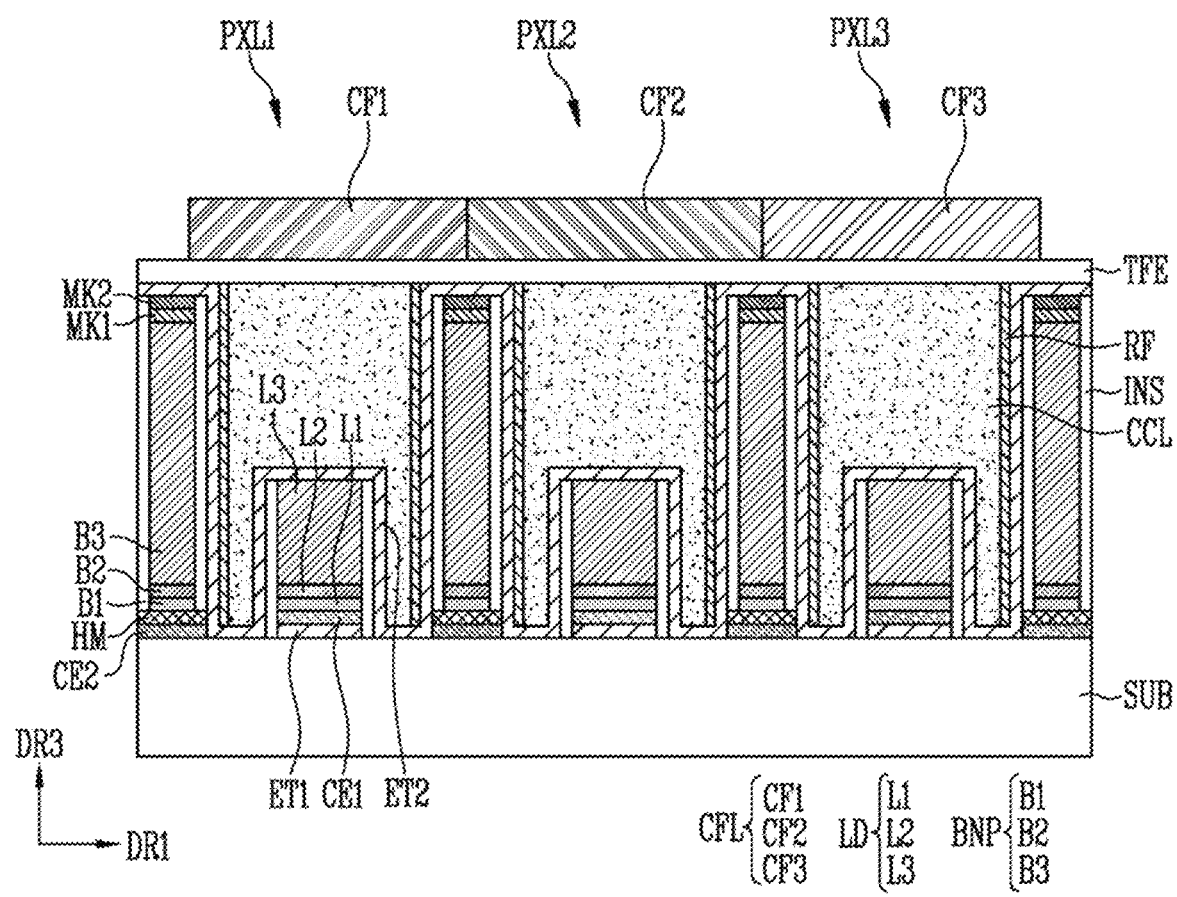
FIGS. 16 and 17 are schematic cross-sectional views illustrating examples of a manufacturing method of a color filter of the display device shown in FIG. 1.
Figure 17:
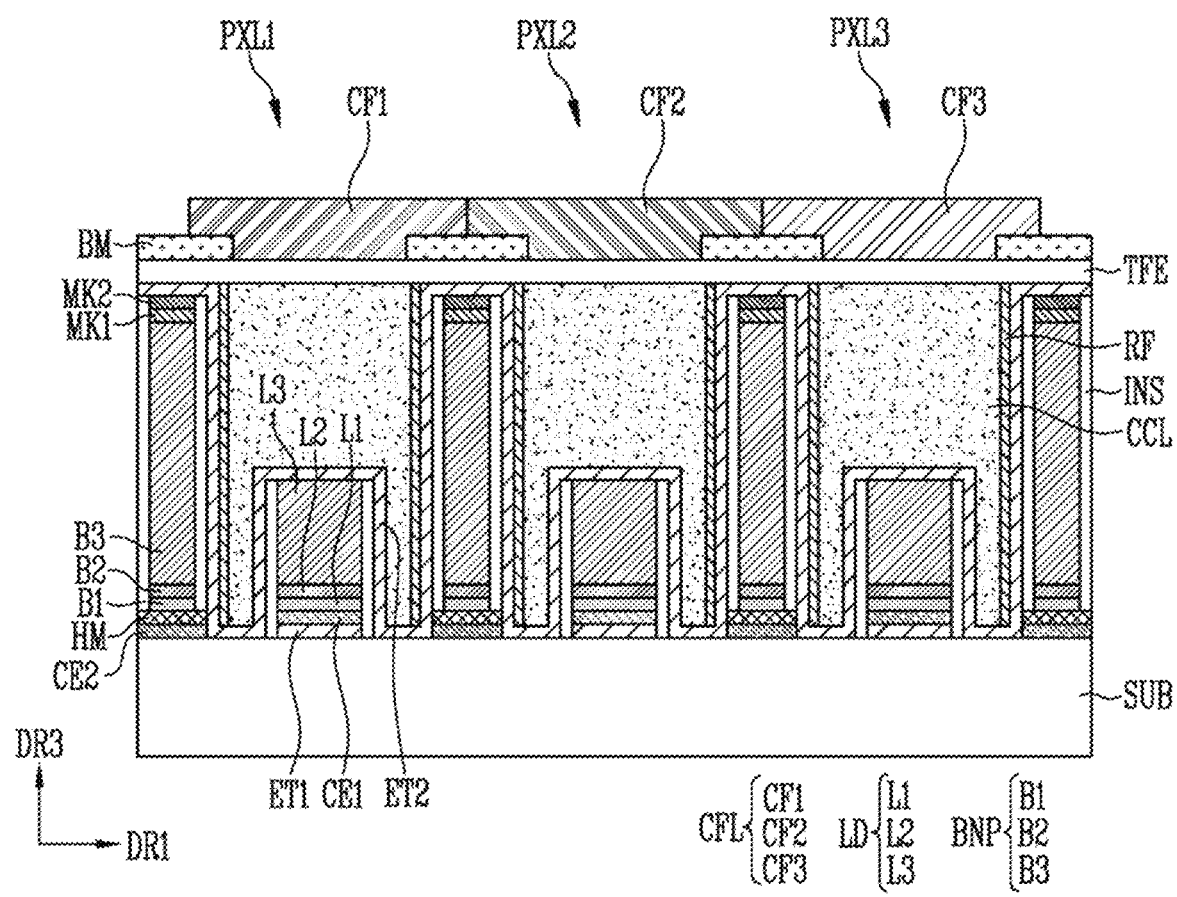

FIGS. 16 and 17 are schematic cross-sectional views illustrating examples of a manufacturing method of a color filter of the display device shown in FIG. 1.

Referring to FIGS. 16 and 17, a color filter layer CFL including first to third color filters CF1, CF2, and CF3 may be formed on the encapsulation layer TFE.

In an embodiment, partial areas of the color filters adjacent to each other may contact each other or be mixed with each other. For example, partial areas of the first color filter CF1 and the second color filter CF2 may be formed to contact each other or be mixed with each other. Similarly, partial areas of the second color filter CF2 and the third color filter CF3 may be formed to contact each other or mixed with each other.

As shown in FIG. 17, a light blocking pattern BM may be formed on the encapsulation layer TFE before the color filter layer CFL is formed. The light blocking pattern BM may overlap the bank pattern BNP above the bank pattern BNP. The color filter layer CFL may be formed to cover the light blocking pattern BM.

However, the embodiments are not limited thereto. The light blocking pattern BM may be formed after the color filter layer CFL is formed, as in FIG. 11.

Subsequently, a meta structure layer may be formed on the color filter layer CFL.

FIGS. 18 to 21 are schematic views illustrating electronic devices including a display device in accordance with embodiments of the disclosure.

Referring to FIGS. 1, 18, 19, 20, and 21, the display device DD may be applied to various types of electronic devices.

Figure 18:
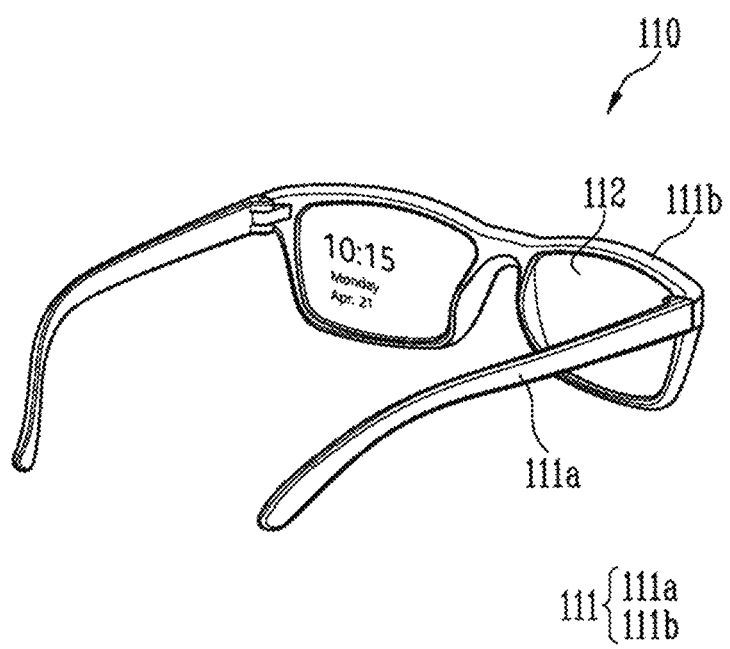
FIGS. 18 to 21 are schematic views illustrating examples of an electronic device including a display device in accordance with embodiments.

As shown in FIG. 18, the display device DD may be applied to smart glasses 110. The smart glasses 110 may include a frame 111 and a lens part 112. The smart glasses 110 are a wearable electronic device which may be worn on the face of a user, and may have a structure in which a portion of the frame 111 is folded or unfolded. For example, the smart glasses 110 may be a wearable device for Augmented Reality (AR).

The frame 111 may include a housing 111b supporting the lens part 112 and a leg part 111a for allowing the user to wear the smart glasses. The leg part 111a may be connected to the housing 111b by a hinge to be folded or unfolded.

A battery, a touch pad, a microphone, and/or a camera may be built in the frame 111. A projector for outputting light and/or a processor for controlling a light signal may be built in the frame 111.

The lens part 112 may be an optical member which allows light to be transmitted therethrough or allows light to be reflected thereby. The lens part 112 may include glass and/or transparent synthetic resin.

The display device DD in accordance with the embodiments of the disclosure may be applied to the lens part 112. For example, a user may recognize an image displayed by a light signal transmitted from the projector of the frame 111 through the lens part 112. For example, the user may recognize information such as a time, a data, and the like, which are displayed on the lens part 112. In some embodiments, the display device DD may be implemented as a transparent display device which enables the user to view an image on both surfaces of the lens part 112 and enables the user to recognize an object over the lens part 112.

Figure 19:
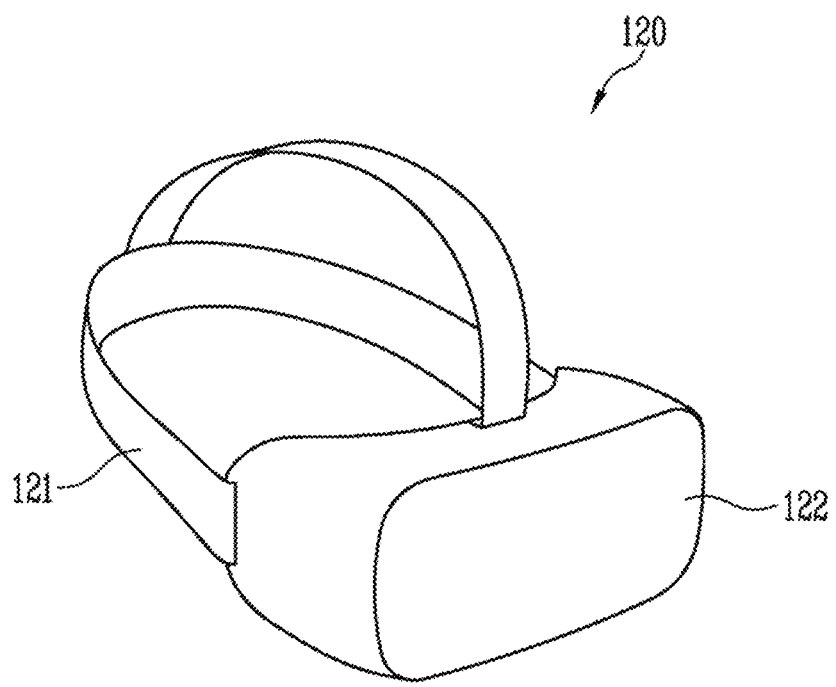

In an embodiment, as shown in FIG. 19, the display device DD in accordance with the embodiments of the disclosure may be applied to a Head Mounted Display (HMD) 120. The HMD 120 may include a head mounted band 121 and a display accommodating case 122. For example, the HMD 120 is a wearable electronic device which may be worn on the head of a user.

The head mounted band 180 may be electrically connected to the display accommodating case 122, to fix the display accommodating case 122. As shown in FIG. 19, the head mounted band 121 may include a horizontal band and a vertical band to allow the HMD 120 to be fixed to the head of the user. The horizontal band may be provided to surround a side portion of the head of the user, and the vertical band may be provided to surround an upper portion of the head of the user. However, the disclosure is not limited thereto, and the head mounted band 121 may be formed in the shape of a glasses frame or a helmet.

The display accommodating case 122 accommodates the display device DD, and may include at least one lens. The lens may provide an image to the user. For example, the display device DD may be applied to a left-eye lens and a right-eye lens, which are implemented in the display accommodating case 122.

Figure 20:
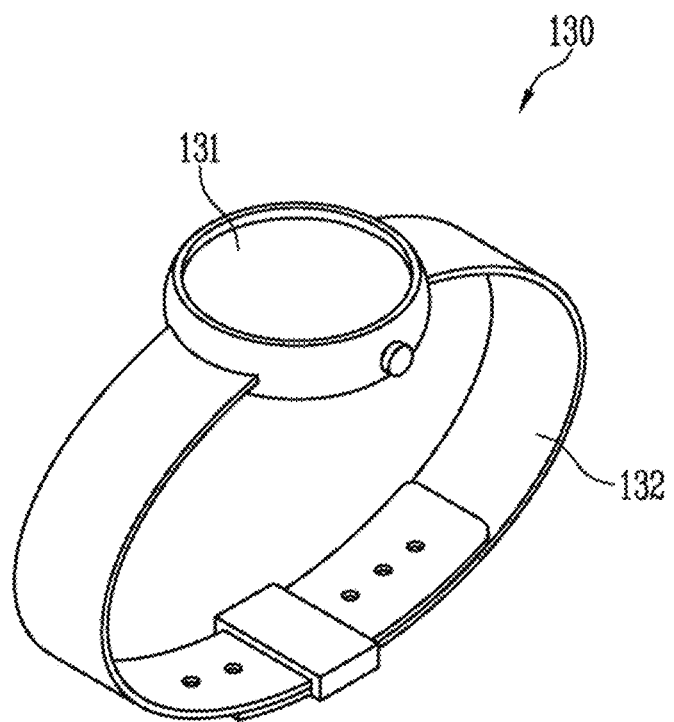

In an embodiment, as shown in FIG. 20, the display device DD may be applied to a smart watch 130. The smart watch 130 may include a display part 131 and a strap part 1320. The smart watch 130 is a wearable electronic device, and may be mounted on a wrist of a user. The display device DD in accordance with the embodiments of the disclosure may be applied to the display part 131. For example, the display part 131 may provide image data including information of a time, a data, and the like.

Figure 21:
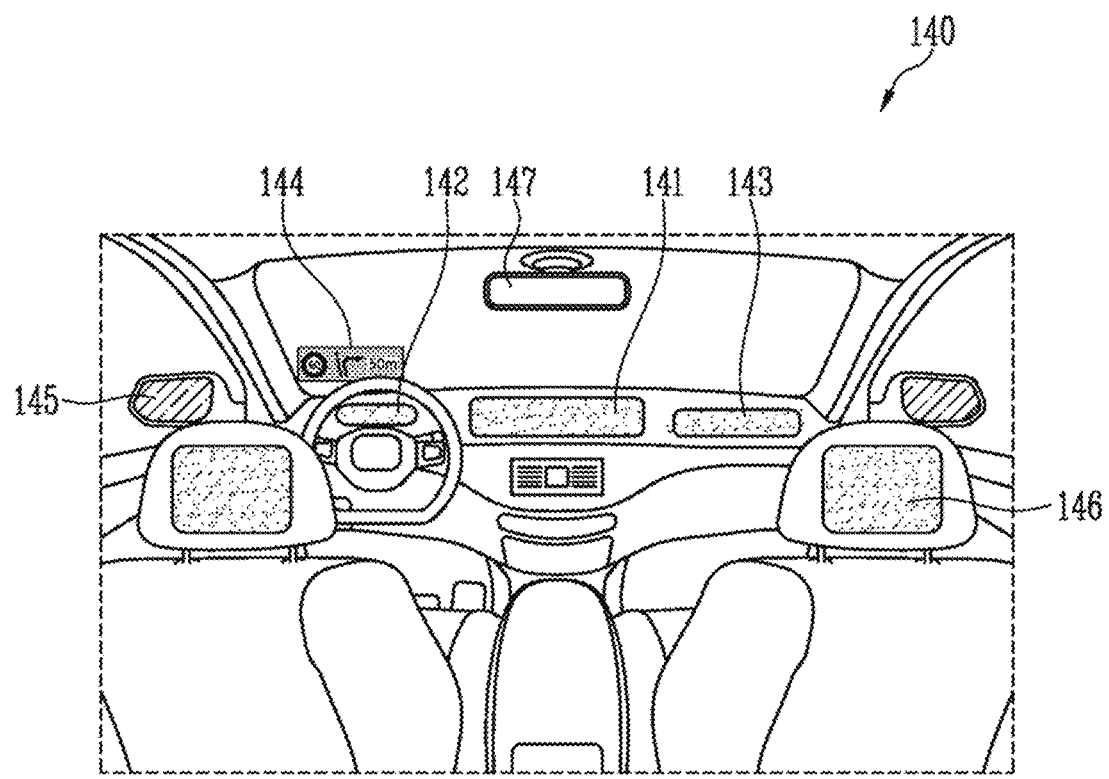

In an embodiment, as shown in FIG. 21, the display device DD may be applied to an automotive display 140. For example, the automotive display 140 may be an electronic device provided inside and/or outside of a vehicle to provide image data.

For example, the display device DD may be applied to an infotainment panel 141, a cluster 142, a co-driver display 143, a head-up display 144, a side mirror display 145, and a read seat display 146, and a rear-view mirror display 147, which are provided in the vehicle.

As described above, the display device in accordance with the embodiments of the disclosure includes the meta structure layer provided on the color filter layer, so that the light emission efficiency of light (the intensity of light) emitted from the pixels may be improved, or the light distribution of the emitted light may be adaptively controlled by controlling the convergence, deflection, diffusion, and polarization of the emitted light to correspond to design purposes. Accordingly, the image quality of the display device may be improved. The light emitting element and the bank pattern are simultaneously formed, and the color conversion layer is filled between the bank patterns, so that the manufacturing process of the display device may be simplified, and the thickness of the display device may be decreased.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A display device comprising:
a first electrode disposed on a surface of a substrate;
a light emitting element disposed on the first electrode, the light emitting element being electrically connected to the first electrode;
a second electrode disposed on the light emitting element, the second electrode being electrically connected to the light emitting element;
a meta structure disposed on the second electrode, the meta structure overlapping the light emitting element in a direction perpendicular to the surface; and
a bank pattern disposed on the substrate,
wherein the light emitting element does not overlap the bank pattern in the direction.

2. A display device comprising:
a first electrode disposed on a substrate;
a light emitting element disposed on the first electrode, the light emitting element being electrically connected to the first electrode;
a second electrode disposed on the light emitting element, the second electrode being electrically connected to the light emitting element;
a meta structure disposed on the second electrode, the meta structure overlapping the light emitting element;
a bank pattern disposed on the substrate, the bank pattern being spaced apart from the light emitting element;
a color conversion layer disposed on a side surface of the bank pattern and disposed on the light emitting element;
an encapsulation layer covering the second electrode and the bank pattern; and
a color filter layer disposed on the encapsulation layer.

3. The display device of claim 2, wherein the color conversion layer fills a space between the bank pattern and the light emitting element.

4. The display device of claim 2, wherein the meta structure comprises:
a transparent base layer disposed on the color filter layer; and
a nano optical pattern disposed on the transparent base layer.

5. The display device of claim 2, wherein the meta structure comprises:
a transparent base layer disposed on the encapsulation layer, the transparent base layer and the encapsulation layer being integral with each other; and
a nano optical pattern disposed on the transparent base layer.

6. The display device of claim 5, wherein the color filter layer is disposed on the meta structure.

7. The display device of claim 2, wherein the light emitting element and the bank pattern are formed on a same layer and include a same material.

8. The display device of claim 7, wherein each of the light emitting element and the bank pattern comprises:
a first semiconductor layer;
a second semiconductor layer disposed on the first semiconductor layer; and
an active layer disposed between the first semiconductor layer and the second semiconductor layer.

9. The display device of claim 8, wherein the bank pattern further comprises:
a first mask layer and a second mask layer which are sequentially stacked on the second semiconductor layer.

10. The display device of claim 8, further comprising:
a reflective member disposed on the side surface of the bank pattern, the reflective member reflecting light emitted from the light emitting element in a display direction.

11. The display device of claim 2, wherein the meta structure comprises:
a transparent base layer disposed on the second electrode that is disposed on a top surface of the light emitting element; and
a nano optical pattern disposed on the transparent base layer.

12. The display device of claim 11, wherein the meta structure contacts the color conversion layer.

13. The display device of claim 2, further comprising:
a light blocking pattern disposed on the encapsulation layer and overlapping at least a portion of the bank pattern.

14. The display device of claim 13, wherein the color filter layer contacts a top surface of the light blocking pattern.

15. The display device of claim 13, wherein
the light blocking pattern contacts a side surface of the color filter layer and a side surface of the meta structure, and
the light blocking pattern is disposed on a portion of a top surface of the meta structure.

16. The display device of claim 2, wherein the second electrode, the light emitting element, and the bank pattern are integral with each other.

17. A display device comprising:
a first pixel, a second pixel, and a third pixel that include light emitting elements disposed on a substrate;
bank patterns spaced apart from the light emitting elements, the bank patterns partitioning the first pixel, the second pixel, and the third pixel;
a meta structure overlapping the light emitting elements and including a first meta surface, a second meta surface, and a third meta surface respectively corresponding to the first pixel, the second pixel, and the third pixel; and
a color conversion layer filling a space between the bank patterns and covering the light emitting elements,
wherein patterns of the first meta surface, the second meta surface and the third meta surface are different from each other.

18. The display device of claim 17, further comprising:
an encapsulation layer covering the color conversion layer and the bank patterns; and
a color filter layer disposed on the encapsulation layer, the color filter layer including a first color filter, a second color filter, and a third color filter respectively corresponding to the first pixel, the second pixel, and the third pixel,
wherein the meta structure is disposed on the color filter layer.

19. The display device of claim 17, further comprising:
an encapsulation layer covering the color conversion layer and the bank patterns; and
a color filter layer disposed on the encapsulation layer, the color filter layer including a first color filter, a second color filter, and a third color filter respectively corresponding to the first pixel, the second pixel, and the third pixel,
wherein the meta structure is disposed between the encapsulation layer and the color filter layer.

20. The display device of claim 17, further comprising:
- an encapsulation layer covering the color conversion layer and the bank patterns; and
- a color filter layer disposed on the encapsulation layer, the color filter layer including a first color filter, a second color filter, a third color filter respectively corresponding to the first pixel, the second pixel, and the third pixel, wherein the meta structure is disposed on the light emitting elements, and the color conversion layer covers the meta structure.

* * * * *